(12) United States Patent
Matsuura et al.

(10) Patent No.: US 11,139,312 B2
(45) Date of Patent: Oct. 5, 2021

(54) SEMICONDUCTOR DEVICE

(71) Applicant: Toshiba Memory Corporation, Minato-ku (JP)

(72) Inventors: Osamu Matsuura, Kuwana (JP); Taichi Iwasaki, Yokkaichi (JP); Takuya Inatsuka, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/291,448

(22) Filed: Mar. 4, 2019

(65) Prior Publication Data
US 2020/0083249 A1 Mar. 12, 2020

(30) Foreign Application Priority Data
Sep. 7, 2018 (JP) .............................. JP2018-167710

(51) Int. Cl.
| | |
|---|---|
| *H01L 27/11582* | (2017.01) |
| *H01L 27/11565* | (2017.01) |
| *H01L 27/1157* | (2017.01) |
| *H01L 23/532* | (2006.01) |
| *H01L 23/522* | (2006.01) |
| *H01L 23/528* | (2006.01) |
| *H01L 21/28* | (2006.01) |

(52) U.S. Cl.
CPC .... *H01L 27/11582* (2013.01); *H01L 23/5226* (2013.01); *H01L 23/5283* (2013.01); *H01L 23/53209* (2013.01); *H01L 27/1157* (2013.01); *H01L 27/11565* (2013.01); *H01L 29/40117* (2019.08)

(58) Field of Classification Search
CPC ........... H01L 27/11582; H01L 23/5226; H01L 23/5283; H01L 27/11565; H01L 27/1157; H01L 29/40117; H01L 23/53209
See application file for complete search history.

(56) References Cited

U.S. PATENT DOCUMENTS

| | | | |
|---|---|---|---|
| 7,498,218 B2 * | 3/2009 | Ahn | ................ H01L 21/28525 438/233 |
| 7,829,419 B2 | 11/2010 | Tanaka | |
| 9,236,388 B2 | 1/2016 | Iwasa | |

(Continued)

FOREIGN PATENT DOCUMENTS

| | | |
|---|---|---|
| CN | 106170832 A | 11/2016 |
| CN | 107039453 A | 8/2017 |

(Continued)

*Primary Examiner* — Nathan W Ha
(74) *Attorney, Agent, or Firm* — Oblon, McClelland, Maier & Neustadt, L.L.P.

(57) ABSTRACT

A semiconductor device according to an embodiment includes an N-well region, a first gate electrode, a single-crystal first semiconductor, and a first contact. The N-well region includes two P-type impurity diffusion regions. The first gate electrode is provided above the N-well region between the two P-type impurity diffusion regions. The first gate electrode is opposed to the N-well region via a gate insulating film. The single-crystal first semiconductor is provided in a columnar shape on the P-type impurity diffusion region. The first contact includes a polycrystalline second semiconductor. The second semiconductor is provided on the first semiconductor and includes P-type impurities.

20 Claims, 20 Drawing Sheets

(56) References Cited

U.S. PATENT DOCUMENTS

| | | | |
|---|---|---|---|
| 9,741,812 B1* | 8/2017 | Adusumilli | H01L 23/485 |
| 9,882,015 B2 | 1/2018 | Hu | |
| 10,355,017 B1* | 7/2019 | Nakatsuji | H01L 21/823878 |
| 2005/0275102 A1 | 12/2005 | Ahn | |
| 2009/0101968 A1 | 4/2009 | Sugioka | |
| 2012/0161318 A1* | 6/2012 | Min | H01L 28/40 |
| | | | 257/751 |
| 2013/0070508 A1 | 3/2013 | Fukuzumi et al. | |
| 2016/0093367 A1* | 3/2016 | Luan | G11C 11/419 |
| | | | 365/156 |
| 2016/0111504 A1* | 4/2016 | Poelzl | H01L 29/66348 |
| | | | 257/330 |
| 2016/0343660 A1* | 11/2016 | Kim | H01L 23/5226 |
| 2016/0358933 A1* | 12/2016 | Rabkin | H01L 29/7926 |
| 2017/0040449 A1* | 2/2017 | Asenov | H01L 29/41775 |
| 2017/0084333 A1 | 3/2017 | Yoo et al. | |
| 2017/0125538 A1* | 5/2017 | Sharangpani | H01L 27/11563 |
| 2017/0148669 A1* | 5/2017 | Kamineni | H01L 29/78 |
| 2017/0179028 A1 | 6/2017 | Lee et al. | |
| 2017/0236746 A1* | 8/2017 | Yu | H01L 27/11582 |
| | | | 257/314 |
| 2017/0352738 A1* | 12/2017 | Balakrishnan | H01L 29/24 |
| 2019/0097006 A1* | 3/2019 | Li | H01L 21/823475 |
| 2019/0139823 A1* | 5/2019 | Chen | H01L 21/76802 |
| 2020/0066602 A1* | 2/2020 | Greene | H01L 21/76865 |

FOREIGN PATENT DOCUMENTS

| | | |
|---|---|---|
| JP | 2-34930 | 2/1990 |
| JP | 2005-354029 | 12/2005 |
| JP | 2013-65604 | 4/2013 |

* cited by examiner

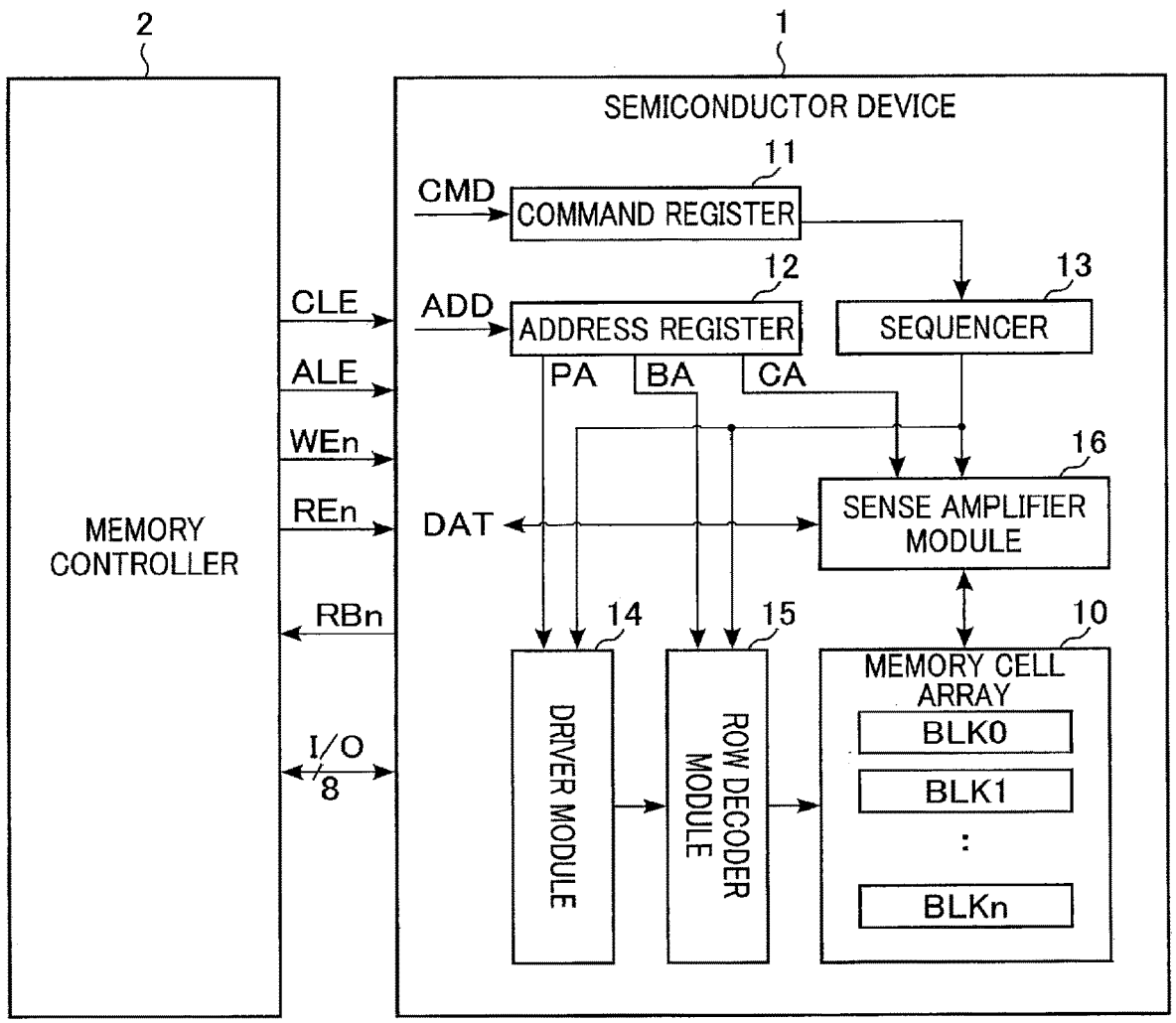
F I G. 1

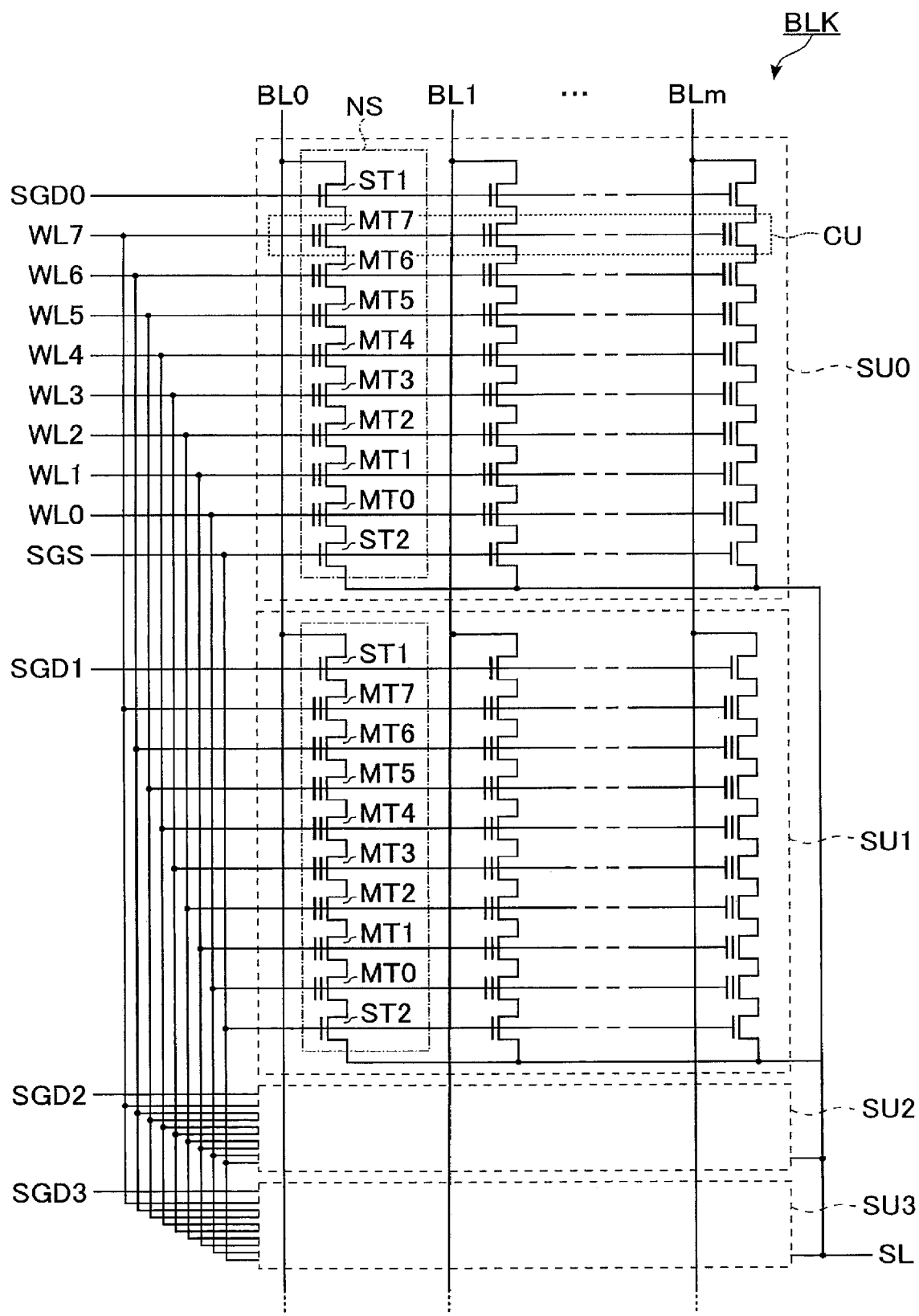
F I G. 2

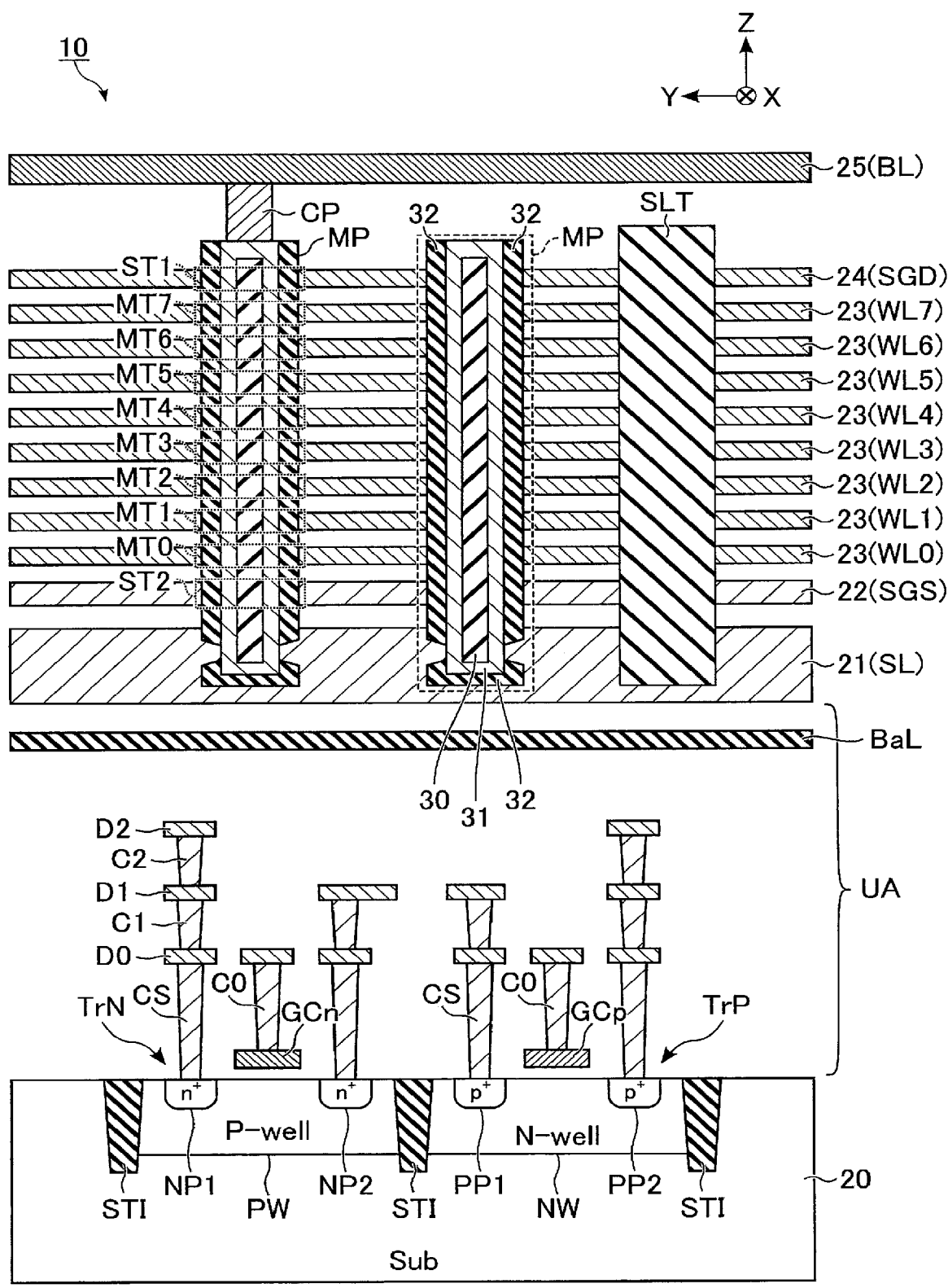
F I G. 4

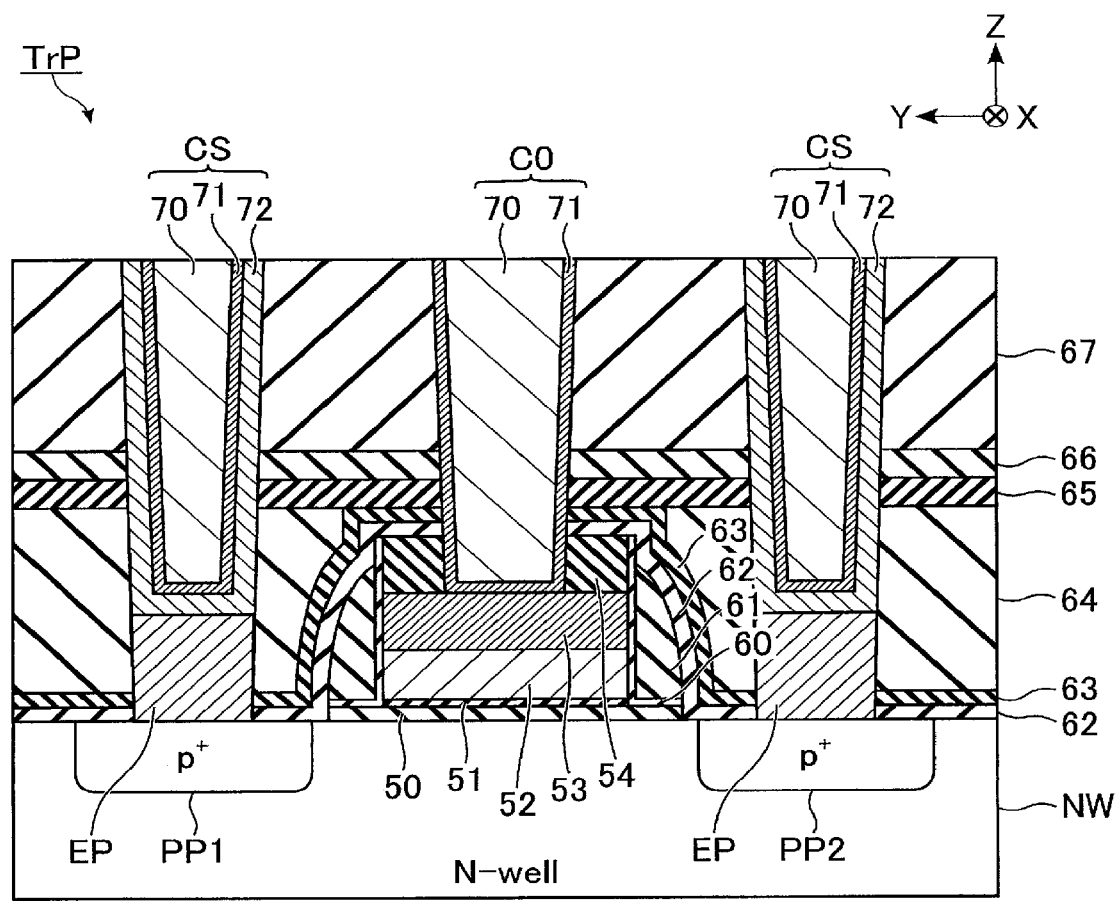
F I G. 7

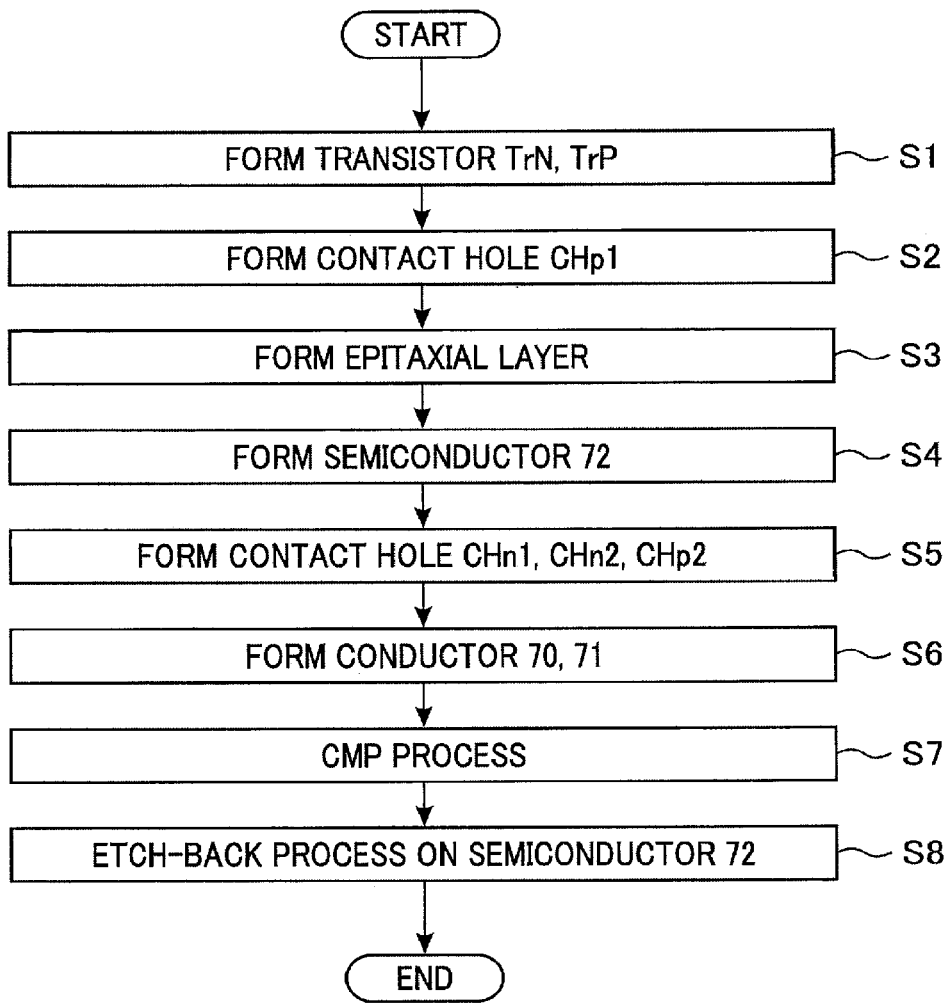
F I G. 8

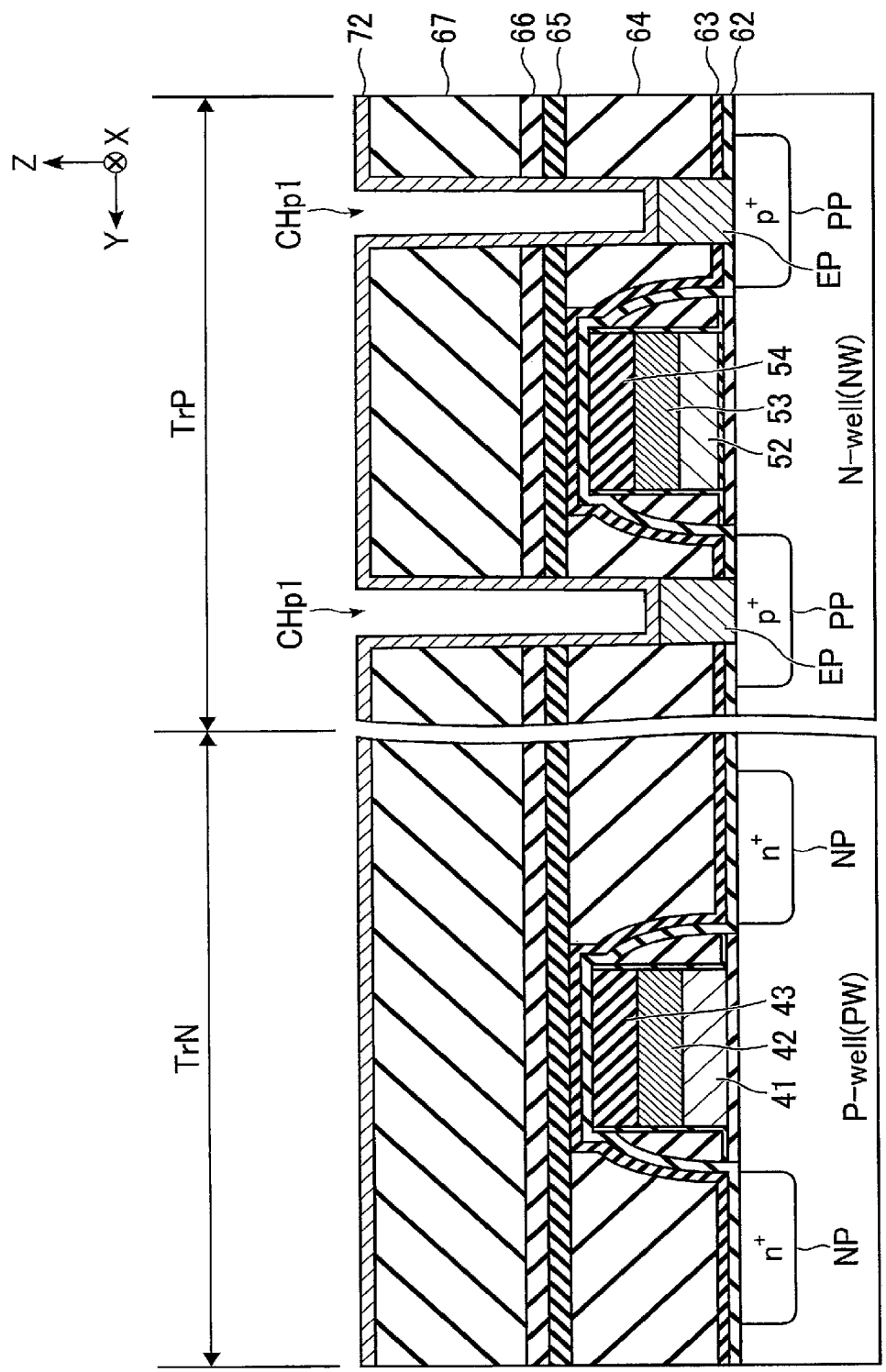
F I G. 12

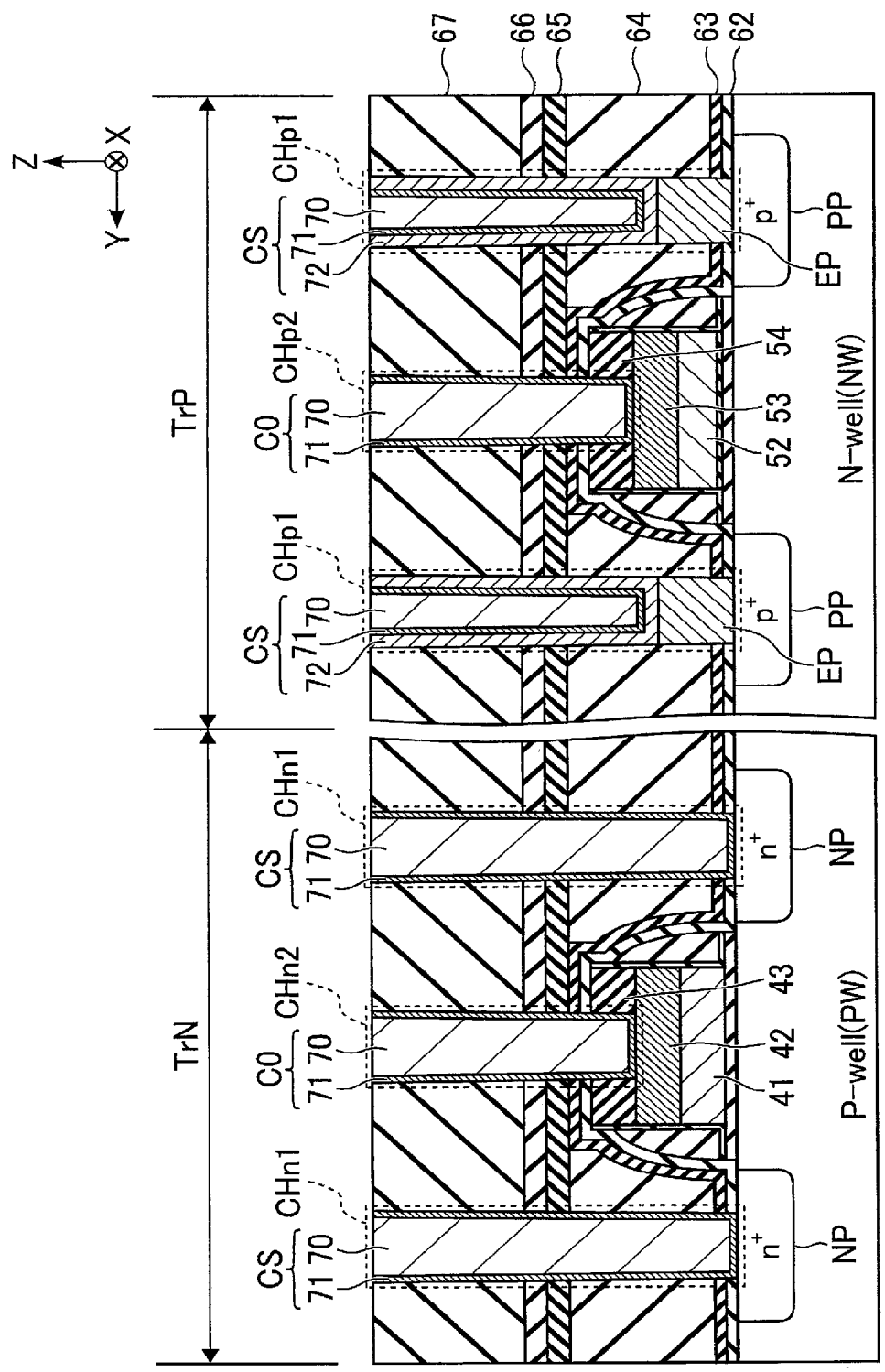
F I G. 14

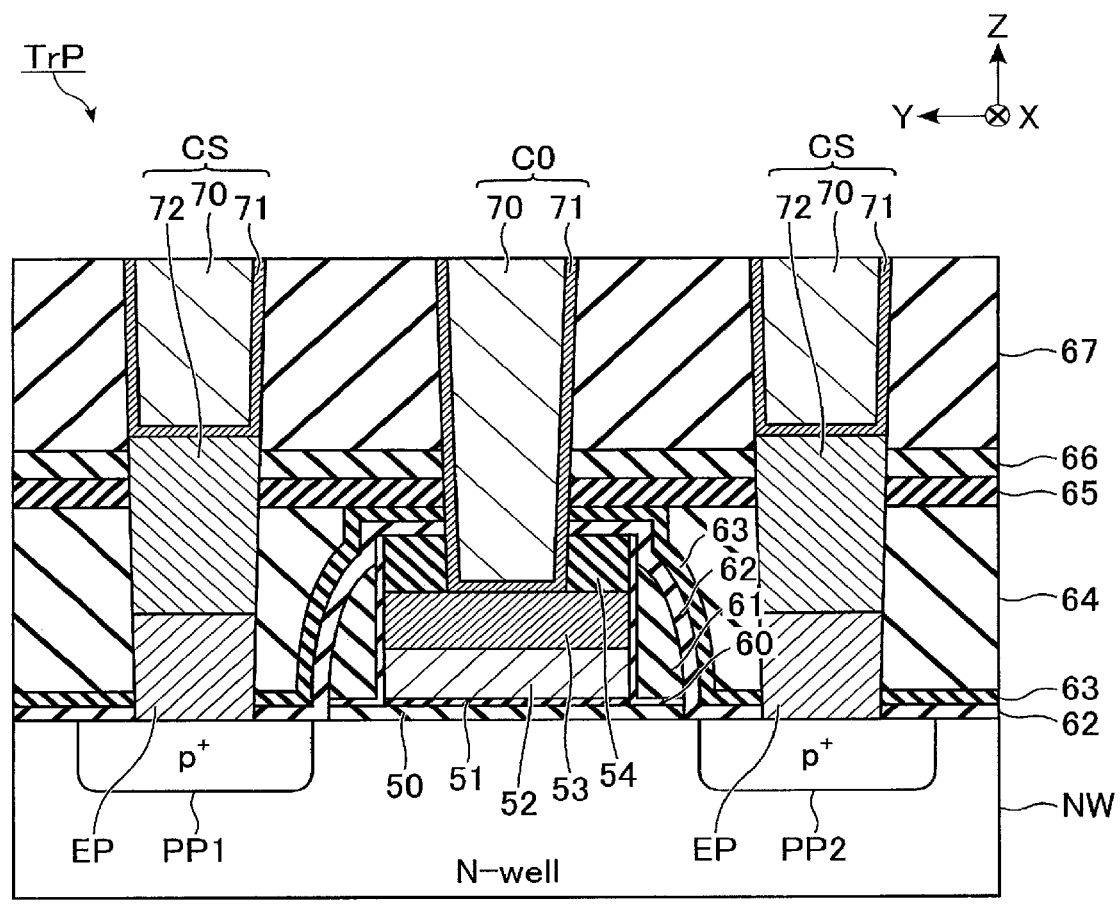
F I G. 15

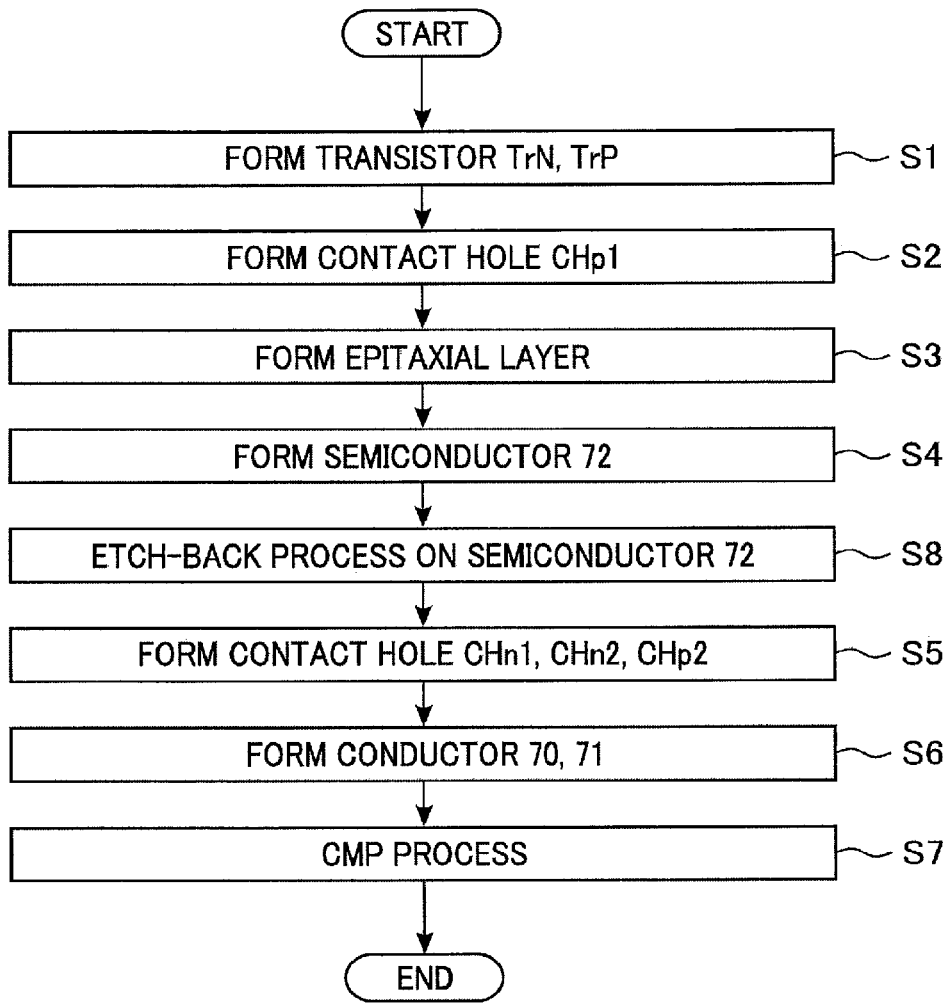
F I G. 16

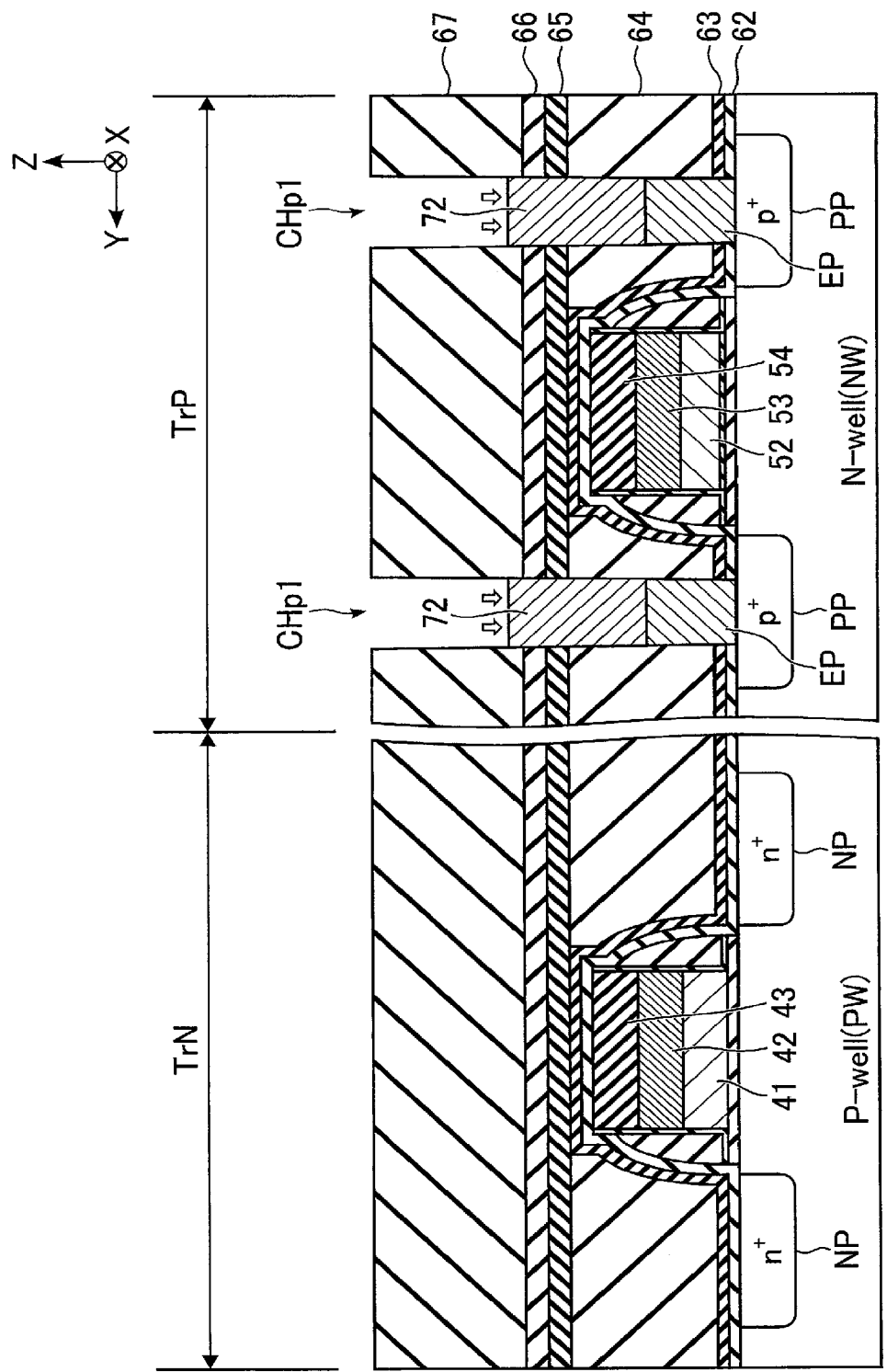
F I G. 18

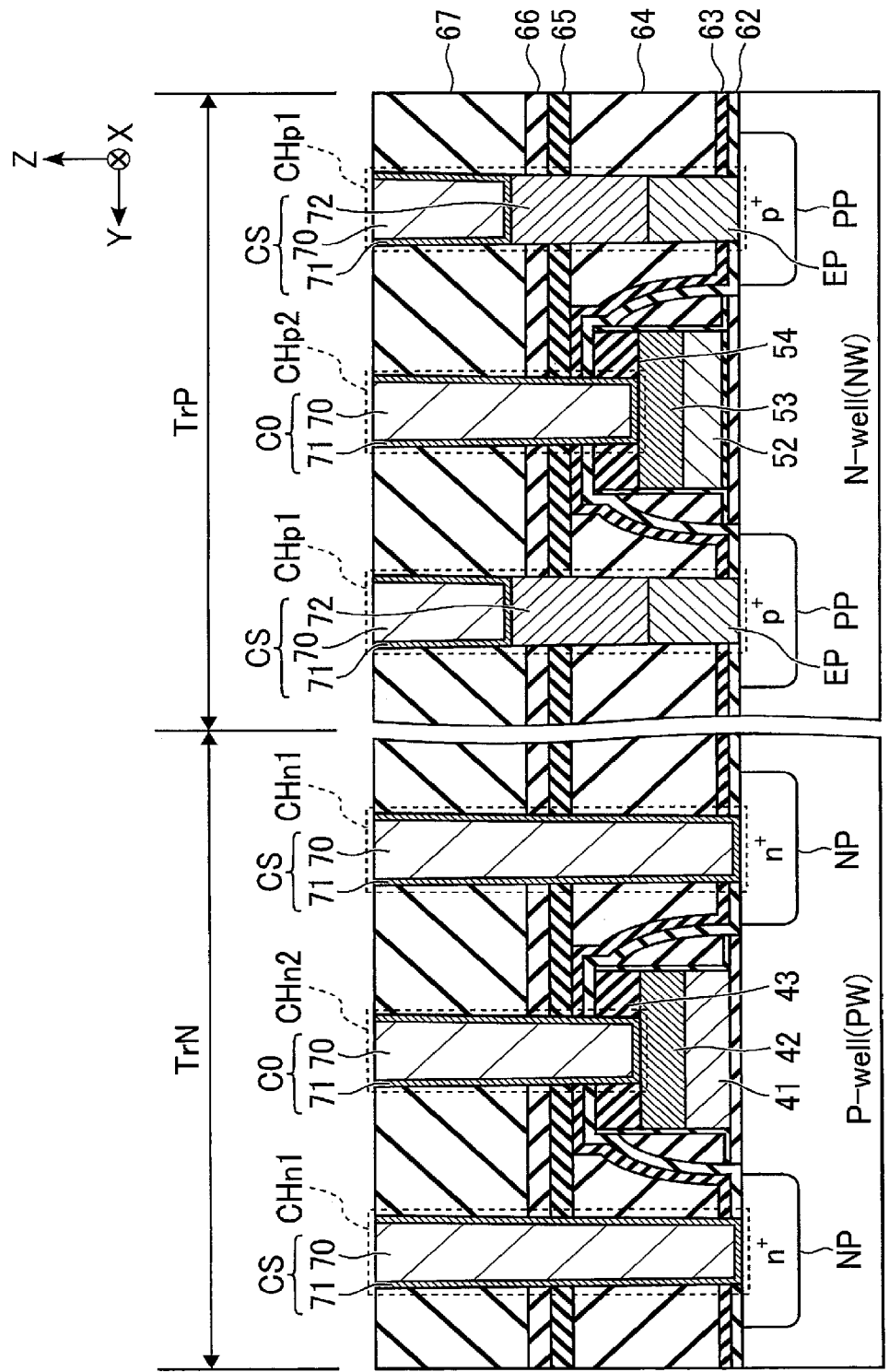
F I G. 20

SEMICONDUCTOR DEVICE

CROSS-REFERENCE TO RELATED APPLICATIONS

This application is based upon and claims the benefit of priority from Japanese Patent Application No. 2018-167710, filed Sep. 7, 2018, the entire contents of which are incorporated herein by reference.

FIELD

Embodiments relate to a semiconductor device.

BACKGROUND

There is known a NAND flash memory which can store data nonvolatilely.

BRIEF DESCRIPTION OF THE DRAWINGS

FIG. 1 is a block diagram illustrating a configuration example of a semiconductor device according to a first embodiment.

FIG. 2 is a circuit diagram illustrating an example of a circuit configuration of a memory cell array included in the semiconductor device according to the first embodiment.

FIG. 4 is a cross-sectional view illustrating an example of a cross-sectional structure of the memory cell array included in the semiconductor device according to the first embodiment.

FIG. 7 is a cross-sectional view illustrating an example of a cross-sectional structure of a PMOS transistor under the memory cell array in the semiconductor device according to the first embodiment.

FIG. 8 is a flowchart illustrating an example of manufacturing steps of the semiconductor device according to the first embodiment.

FIGS. 9, 10, 11, 12, 13, and 14 are a cross-sectional views of an NMOS transistor and a PMOS transistor, and illustrating an example of a manufacturing step of the semiconductor device according to the first embodiment.

FIG. 15 is a cross-sectional view illustrating an example of a cross-sectional structure of a PMOS transistor under the memory cell array in the semiconductor device according to the second embodiment.

FIG. 16 is a flowchart illustrating an example of manufacturing steps of the semiconductor device according to the second embodiment.

FIGS. 17, 18, 19, and 20 are a cross-sectional views of an NMOS transistor and a PMOS transistor, and illustrating an example of a manufacturing step of the semiconductor device according to the second embodiment.

DETAILED DESCRIPTION

Figure 3:
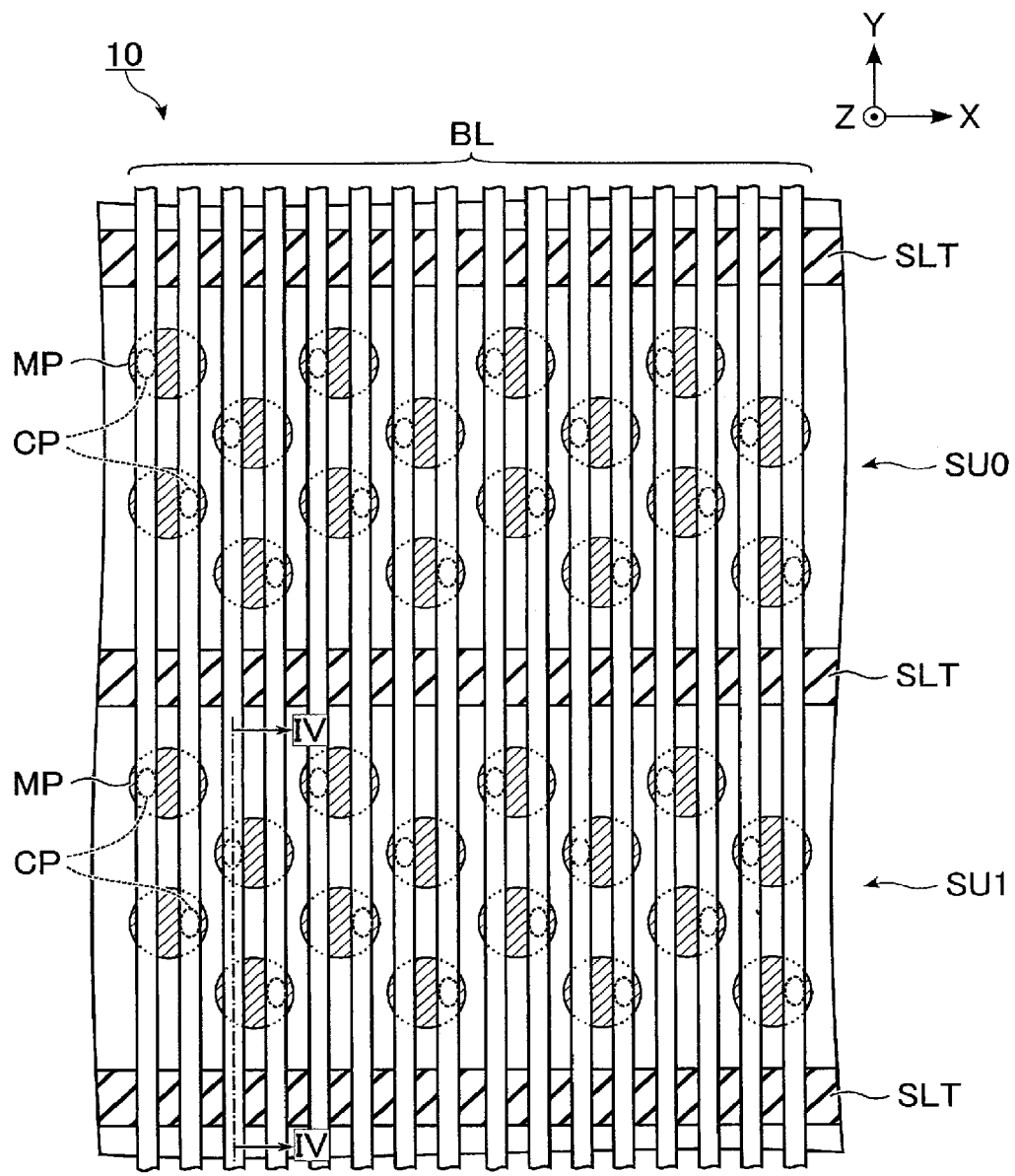
FIG. 3 is a plan view illustrating an example of a planer layout of the memory cell array included in the semiconductor device according to the first embodiment.

A semiconductor device according to an embodiment includes an N-well region, a first gate electrode, a single-crystal first semiconductor, and a first contact. The N-well region includes two P-type impurity diffusion regions. The first gate electrode is provided above the N-well region between the two P-type impurity diffusion regions. The first gate electrode is opposed to the N-well region via a gate insulating film. The single-crystal first semiconductor is provided in a columnar shape on at least one of the two P-type impurity diffusion regions. The first contact includes a polycrystalline second semiconductor. The second semiconductor is provided on the first semiconductor and includes P-type impurities.

Hereinafter, embodiments will be described with reference to the accompanying drawings. The embodiments illustrate devices and methods for embodying the technical concept of the invention. The drawings are schematic or conceptual ones. The dimensions, ratios, etc. in the drawings do not necessarily agree with the actual ones. The technical concept of the present invention is not specified by shapes, structures, dispositions, etc. of structural elements.

In the following description, structural elements having substantially the same function and configuration are denoted by the same reference signs. Numeric characters after the letters constituting a reference sign are referred to by reference signs containing the same letters, and are used to distinguish elements having the same structure. When the elements denoted by the reference signs containing the same letters do not need to be distinguished from each other, these elements are referred to by the reference signs containing only the letters.

[1] First Embodiment

FIG. 1 illustrates a configuration example of a semiconductor device 1 according to a first embodiment. The semiconductor device 1 according to the first embodiment will be described hereinafter.

[1-1] Configuration of Semiconductor Device 1

[1-1-1] Entire Configuration of Semiconductor Device 1

The semiconductor device 1 is, for example, a NAND flash memory which can store data nonvolatilely. The semiconductor device 1 is controlled by, for example, an external memory controller 2.

As illustrated in FIG. 1, the semiconductor device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK is a set of a plurality of memory cells which can store data nonvolatilely, and the block BLK is used, for example, as an erase unit of data.

In addition, in the memory cell array 10, a plurality of bit lines and a plurality of word lines are provided. Each memory cell is associated with, for example, one bit line and one word line. The detailed configuration of the memory cell array 10 will be described later.

The command register 11 holds a command CMD which the semiconductor device 1 received from the memory controller 2. The command CMD includes, for example, commands for causing the sequencer 13 to execute a read operation, a write operation, and an erase operation.

The address register 12 holds address information ADD which the semiconductor device 1 received from the memory controller 2. The address information ADD includes, for example, a block address BA, a page address PA, and a column address CA. For example, the block address BA, page address PA and column address CA are used for selecting a block BLK, a word line and a bit line, respectively.

The sequencer 13 controls the operation of the entirety of the semiconductor device 1. For example, based on the command CMD that is held in the command register 11, the sequencer 13 controls the driver module 14, row decoder module 15 and sense amplifier module 16, and executes a read operation, a write operation and an erase operation.

The driver module 14 generates voltages which are used in the read operation, write operation and erase operation. In addition, the driver module 14 applies the generated voltage to a signal line corresponding to a selected word line, for example, based on the page address PA that is held in the address register 12.

Based on the block address BA that is held in the address register 12, the row decoder module 15 selects one corresponding block BLK in the memory cell array 10. Then, the row decoder module 15 transfers, for example, the voltage, which was applied to the signal line corresponding to the selected word line, to the selected word line in the selected block BLK.

The sense amplifier module 16 applies, in a write operation, a desired voltage to each bit line, in accordance with write data DAT which is received from the memory controller 2. In addition, in a read operation, the sense amplifier module 16 determines data which is stored in a memory cell, based on the voltage of the bit line, and transfers the determination result to the memory controller 2 as read data DAT.

The communication between the semiconductor device 1 and memory controller 2 supports, for example, a NAND interface standard. For example, in the communication between the semiconductor device 1 and memory controller 2, use is made of a command latch enable signal CLE, an address latch enable signal ALE, a write enable signal WEn, a read enable signal REn, a ready/busy signal RBn, and an input/output signal I/O.

The command latch enable signal CLE is a signal indicating that an input/output signal I/O, which the semiconductor device 1 received, is a command CMD. The address latch enable signal ALE is a signal indicating that a signal I/O, which the semiconductor device 1 received, is address information ADD. The write enable signal WEn is a signal which instructs the semiconductor device 1 to input the input/output signal I/O. The read enable signal REn is a signal which instructs the semiconductor device 1 to output the input/output signal I/O.

The ready/busy signal RBn is a signal which notifies the memory controller 2 whether the semiconductor device 1 is in a ready state in which the semiconductor device 1 accepts an instruction from the memory controller 2, or in a busy state in which the semiconductor device 1 does not accept an instruction from the memory controller 2. The input/output signal I/O is, for example, a signal of an 8-bit width, and may include the command CMD, address information ADD, data DAT, etc.

The above-described semiconductor device 1 and memory controller 2 may constitute a single semiconductor device by being combined. Examples of such a semiconductor device include a memory card such as an SD™ card, and a solid state drive (SSD).

[1-1-2] Circuit Configuration of Memory Cell Array 10

FIG. 2 illustrates an example of a circuit configuration of the memory cell array 10 included in the semiconductor device 1 according to the first embodiment, in which the single block BLK is extracted and shown.

As illustrated in FIG. 2, the block BLK includes, for example, four string units SU0 to SU3. Each string unit SU includes a plurality of NAND strings NS.

The NAND strings NS are associated with bit lines BL0 to BLm (m is an integer of 1 or more), respectively. Each NAND string NS includes, for example, memory cell transistors MT0 to MT7, and select transistors ST1 and ST2.

The memory cell transistor MT includes a control gate and a charge accumulation layer, and stores data nonvolatilely. Each of the select transistors ST1 and ST2 is used for selecting the string unit SU in various operations.

In each NAND string NS, the drain of the select transistor ST1 is connected to the associated bit line BL. The source of the select transistor ST1 is connected to one end of the series-connected memory transistors MT0 to MT7. The other end of the series-connected memory transistors MT0 to MT7 is connected to the drain of the select transistor ST2.

In the same block BLK, the source of the select transistor ST2 is commonly connected to a source line SL. The gates of the select transistors ST1 in the string units SU0 to SU3 are commonly connected to select gate lines SGD0 to SGD3, respectively. The control gates of the memory cell transistors MT0 to MT7 are commonly connected to word lines WL0 to WL7. The gates of the select transistors ST2 are commonly connected to a select gate line SGS.

In the above-described circuit configuration of the memory cell array 10, a plurality of NAND strings NS, to which the same column address CA is allocated, are commonly connected to the same bit line BL between a plurality of blocks BLK. The source line SL is commonly connected between blocks BLK.

A group of memory cell transistors MT connected to the common word line WL in the single string unit SU is referred to as a cell unit CU, for example. For example, the storage capacity of the cell unit CU including memory cell transistors MT each storing 1-bit data is defined as "one-page data". The cell unit CU may have a storage capacity of two or more page data according to the number of bits of data stored in the memory cell transistor MT.

The circuit configuration of the memory cell array 10 included in the semiconductor device 1 according to the embodiment, is not limited to the above-described configuration. For example, the number of memory cell transistors MT and the number of select transistors ST1 and ST2 in each NAND string NS may be designed in any number. The number of string units SU included in each of the blocks BLK may be designed in any number.

[1-1-3] Structure of Memory Cell Array 10

Next, an example of the structure of the memory cell array 10 in the first embodiment will be described.

In the drawings to be referred to below, an X direction corresponds to an extending direction of the word lines WL. A Y direction corresponds to an extending direction of the bit lines BL. A Z direction corresponds to a vertical direction corresponding to a surface of a semiconductor substrate 20 on which the semiconductor device 1 is formed.

In addition, in cross-sectional views to be referred to below, constituent elements such as insulating layers (interlayer insulating films), interconnects and contacts, are appropriately omitted in order to make the figure easy to see.

In the plan view, hatching is given as appropriate to make the figure easy to see. The hatching given to the plan view is not necessarily related to the material or characteristics of the hatched component.

FIG. 3 is an example of a planar layout of the memory cell array 10 included in the semiconductor device 1 according to the embodiment, and extracts and illustrates the respective structures corresponding to the string units SU0 and SU1.

As illustrated in FIG. 3, a region in which the memory cell array 10 is formed includes, for example, a plurality of slits SLT, a plurality of string units SU, and a plurality of bit lines BL.

Each of the slits SLT extends in the X direction and are arranged in the Y direction. For example, the single string unit SU is disposed between slits SLT adjacent to each other in the Y direction.

Each of the string units SU includes a plurality of memory pillars MP. The memory pillars MP are arranged, for example, in a zigzag manner in the X direction. Each of the memory pillars MP functions as, for example, single NAND string NS.

The bit lines BL each extend in the Y direction and are arranged in the X direction. For example, each of the bit lines BL is disposed so as to overlap with at least one memory pillar MP for each of the string units SU. Specifically, two bit lines BL, for instance, overlap each memory pillar MP.

A contact CP is provided between one of bit lines BL, which overlap a memory pillar MP, and this memory pillar MP. Each of the memory pillars MP is electrically connected to the associated bit line BL via the contact CP.

The number of string units SU provided between the adjacent slits SLT may be designed in any number. The number and arrangement of memory pillars MP illustrated in FIG. 3 are merely examples, and the memory pillars MP may be designed in any number and arrangement. The number of bit lines BL overlapping with each of the memory pillars MP may be designed in any number.

FIG. 4 is a cross-sectional view taken along the line IV-IV of FIG. 3, and illustrates an example of a cross-sectional structure of the memory cell array 10 included in the semiconductor device 1 according to the embodiment.

As illustrated in FIG. 4, a region where the memory cell array 10 is formed includes, for example, conductors 21 to 25, memory pillars MP, contacts CP, and slits SLT.

Concretely, an insulating layer UA is provided on the semiconductor substrate 20. In the insulating layer UA, for example, a circuit such as the sense amplifier module 16 is provided. This circuit includes, for example, an NMOS transistor TrN and a PMOS transistor TrP. The details of configurations relating to the NMOS transistor TrN and PMOS transistor TrP will be described later.

The conductor 21 is provided on the insulating layer UA. For example, the conductor 21 is formed in a plate shape extending in an XY plane, and is used as the source line SL. The conductor 21 includes, for example, silicon (Si).

The conductor 22 is provided above the conductor 21 with an insulating layer interposed therebetween. For example, the conductor 22 is formed in a plate shape extending along the XY plane, and is used as the select gate line SGS. The conductor 22 includes, for example, silicon (Si).

Insulating layers and conductors 23 are alternately stacked above the conductor 22. For example, each conductor 23 is formed in a plate shape extending along the XY plane. The stacked conductors 23 are used as word lines WL0 to WL7 in the order from the semiconductor substrate 20 side. Each conductor 23 includes, for example, tungsten (W).

The conductor 24 is provided above the uppermost conductor 23 with an insulating layer interposed therebetween. The conductor 24 is formed, for example, in a plate shape extending along the XY plane, and used as the select gate line SGD. The conductor 24 includes, for example, tungsten (W).

The conductor 25 is provided above the conductor 24 with an insulating layer interposed therebetween. For example, the conductor 25 is formed in a line shape extending along the Y direction, and used as the bit line BL. Specifically, in a region not illustrated, a plurality of conductors 25 are arranged in the X direction. The conductor 25 includes, for example, copper (Cu).

The memory pillar MP is formed in a columnar shape extending along the Z direction, and penetrates, for example, the conductors 22 to 24. Concretely, an upper end of the memory pillar MP is included, for example, in a layer between a layer provided with the conductor 24 and a layer provided with the conductor 25. A lower end of the memory pillar MP is included, for example, in a layer provided with the conductor 21.

In addition, the memory pillar MP includes a core member 30, a semiconductor 31 and a multilayer film 32.

The core member 30 is formed in a columnar shape extending along the Z direction. An upper end of the core member 30 is included, for example, in a layer above the layer provided with the conductor 24. A lower end of the core member 30 is included, for example, in the layer provided with the conductor 21. The core member 30 includes, for example, an insulator such as silicon oxide ($SiO_2$).

The core member 30 is covered with the semiconductor 31. The semiconductor 31 is put in contact with the conductor 21, for example, via a side surface of the memory pillar MP. The semiconductor 31 is, for example, polycrystalline silicon (Si). The multilayer film 32 covers the side surface and bottom surface of the semiconductor 31, excluding the part at which the conductor 21 and semiconductor 31 are put in contact.

Figure 5:
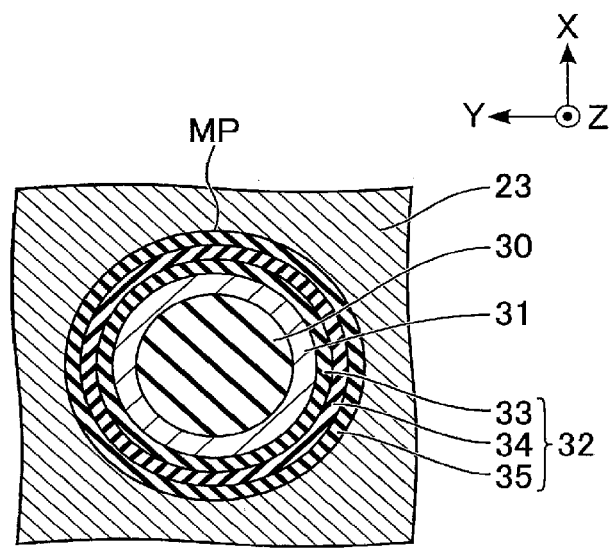
FIG. 5 is a cross-sectional view illustrating an example of a cross-sectional structure of a memory pillar in the semiconductor device according to the first embodiment.

FIG. 5 illustrates an example of a cross-sectional structure of the memory pillar MP in a cross section which is parallel to the surface of the semiconductor substrate 20 and includes the conductor 23.

As illustrated in FIG. 5, in the layer including the conductor 23, the core member 30 is provided in the central portion of the memory pillar MP. The semiconductor 31 surrounds the side surface of the core member 30. The multilayer film 32 surrounds the side surface of the semiconductor 31. The multilayer film 32 includes, for example, a tunnel oxide film 33, an insulating film 34 and a block insulating film 35.

The tunnel oxide film 33 surrounds the side surface of the semiconductor 31. The insulating film 34 surrounds the side surface of the tunnel oxide film 33. The block insulating film 35 surrounds the side surface of the insulating film 34. The conductor 23 surrounds the side surface of the block insulating film 35.

The tunnel oxide film 33 includes, for example, silicon oxide ($SiO_2$). The insulating film 34 includes, for example, silicon nitride (SiN). The block insulating film 35 includes, for example, silicon oxide ($SiO_2$).

Referring back to FIG. 4, a columnar contact CP is provided on the semiconductor 31. In the region illustrated, a contact CP corresponding to one of the two memory pillars MP is depicted. In a region not illustrated, a contact CP is connected to the memory pillar MP to which the contact CP is not connected in the illustrated region.

One conductor 25, i.e. one bit line BL, is connected to a top surface of the contact CP. The memory pillar MP and conductor 25 may be electrically connected via two or more contacts, or may be electrically connected via some other interconnect.

The slit SLT is formed in a plate shape extending along the Z direction, and divides, for example, the conductors 22 to 24. Concretely, an upper end of the slit SLT is included, for example, in a layer between a layer including the upper end of the memory pillar MP and a layer provided with the conductor 25. A lower end of the slit SLT is included, for example, in a layer provided with the conductor 21.

An insulator is provided in the inside of the slit SLT. The insulator includes, for example, an insulating material such as silicon oxide ($SiO_2$). Note that the inside of the slit SLT may be composed of a plurality of kinds of insulators. For example, before silicon oxide is buried in the slit SLT, silicon nitride (SiN) may be formed as a side wall of the slit SLT.

In the above-described configuration of the memory pillar MP, for example, a portion where the memory pillar MP intersects the conductor 22 functions as the select transistor ST2. A portion where the memory pillar MP intersects the conductor 23 functions as the memory cell transistor MT. A portion where the memory pillar MP intersects the conductor 24 functions as the select transistor ST1.

Specifically, the semiconductor 31 functions as a channel of each of the memory cell transistors MT and select transistors ST1 and ST2. The insulating film 34 is used as a charge accumulation layer of the memory cell transistor MT.

In the above-described structure of the memory cell array 10, the number of conductors 23 is designed based on the number of word lines WL. A plurality of conductors 24, which are provided in a plurality of layers, may be allocated to the select gate line SGD. A plurality of conductors 22, which are provided in a plurality of layers, may be allocated to the select gate line SGS. When the select gate line SGS is provided in plural layers, conductors that are different from the conductor 22 may be used.

[1-1-4] Structures of NMOS Transistor TrN and PMOS Transistor TrP

Hereinafter, examples of structures of the NMOS transistor TrN and PMOS transistor TrP in the first embodiment will be described.

(Outline of the Structure Under Memory Cell Array 10)

To begin with, further referring to FIG. 4, a description is given of the outline of the structure including the NMOS transistor TrN and PMOS transistor TrP which are provided under the memory cell array 10.

The semiconductor substrate 20 includes, for example, a P-well region PW, an N-well region NW, and element isolation regions STI. The insulating layer UA includes, for example, conductors GC, D0, D1 and D2, contacts CS, C0, C1 and C2, and a barrier layer BaL.

Each of the P-well region PW, N-well region NW and element isolation regions STI is in contact with a top surface of the semiconductor substrate 20. The N-well region NW and P-well region PW are insulated by the element isolation region STI.

The P-well region PW includes $n^+$ impurity diffusion regions NP1 and NP2. The $n^+$ impurity diffusion region NP1 is disposed spaced apart from the $n^+$ impurity diffusion region NP2. Each of the $n^+$ impurity diffusion regions NP1 and NP2 is in contact with the top surface of the semiconductor substrate 20. Each of the $n^+$ impurity diffusion regions NP1 and NP2 is doped with, for example, phosphorus (P).

The N-well region NW includes $p^+$ impurity diffusion regions PP1 and PP2. The $p^+$ impurity diffusion region PP1 is disposed spaced apart from the $p^+$ impurity diffusion region PP2. Each of the $p^+$ impurity diffusion regions PP1 and PP2 is in contact with the top surface of the semiconductor substrate 20. Each of the $p^+$ impurity diffusion regions PP1 and PP2 is doped with, for example, boron (B).

A conductor GCn is provided above the P-well region PW between the $n^+$ impurity diffusion regions NP1 and NP2. A conductor GCp is provided above the N-well region NW between the $p^+$ impurity diffusion regions PP1 and PP2. Each conductor D0 is an interconnect provided in a layer above the conductors GCn and GCp. Each conductor D1 is an interconnect provided in a layer above each conductor D0. Each conductor D2 is an interconnect provided in a layer above each conductor D1.

Each contact CS is a columnar conductor provided between the semiconductor substrate 20 and conductor D0. Each contact C0 is a columnar conductor provided between the conductor GCn or GCp and the conductor D0. Each contact C1 is a columnar conductor provided between the conductor D0 and conductor D1. Each contact C2 is a columnar conductor provided between the conductor D1 and conductor D2.

The $n^+$ impurity diffusion regions NP1 and NP2 and $p^+$ impurity diffusion regions PP1 and PP2 are electrically connected to different conductors D0 via the contacts CS. The conductors GCn and GCp are electrically connected to different conductors D0 via the contacts C0. The conductor D0 and conductor D1 are electrically connected via the contact C1 as appropriate. The conductor D1 and conductor D2 are electrically connected via the contact C2 as appropriate.

The barrier layer BaL is an insulating layer provided in a layer above the conductors D2. In other words, the barrier layer BaL is provided between the structure corresponding to the memory cell array 10 and the circuit provided under the memory cell array 10. When the structure corresponding to the memory cell array 10 is formed in the manufacturing process of the semiconductor device 1, the barrier layer BaL prevents impurities (e.g. hydrogen), which occurs from the structure, from entering the circuit under the memory cell array 10. The barrier layer BaL includes, for example, silicon nitride (SiN).

In the above-described structure, a set of the P-well region PW, $n^+$ impurity diffusion regions NP1 and NP2, and conductor GCn functions as the NMOS transistor TrN. A set of the N-well region NW, $p^+$ impurity diffusion regions PP1 and PP2, and conductor GCp functions as the PMOS transistor TrP.

Specifically, the conductor GCn is used as a gate electrode of the NMOS transistor TrN. One of the $n^+$ impurity diffusion regions NP1 and NP2 functions as a drain of the NMOS transistor TrN, and the other of the $n^+$ impurity diffusion regions NP1 and NP2 functions as a source of the NMOS transistor TrN.

Similarly, the conductor GCp is used as a gate electrode of the PMOS transistor TrP. One of the $p^+$ impurity diffusion regions PP1 and PP2 functions as a drain of the PMOS transistor TrP, and the other of the $p^+$ impurity diffusion regions PP1 and PP2 functions as a source of the PMOS transistor TrP.

(Structure of NMOS Transistor TrN)

Next, an example of a more detailed structure of the NMOS transistor TrN will be described.

Figure 6:
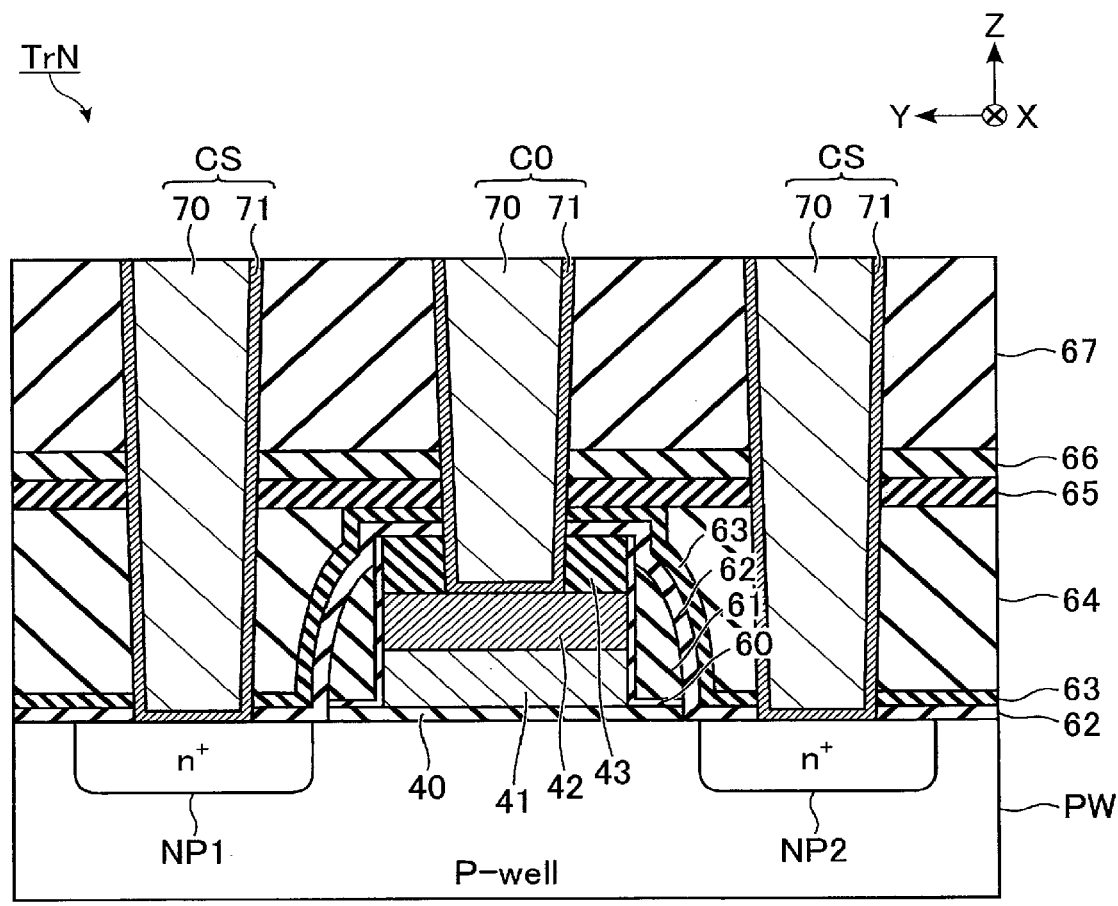
FIG. 6 is a cross-sectional view illustrating an example of a cross-sectional structure of an NMOS transistor under the memory cell array in the semiconductor device according to the first embodiment.

FIG. 6 illustrates an example of a cross-sectional structure of the NMOS transistor TrN under the memory cell array 10 in the semiconductor device 1 according to the first embodiment.

As illustrated in FIG. 6, a region of the NMOS transistor TrN includes the P-well region PW, n$^+$ impurity diffusion regions NP1 and NP2 and contacts CS and C0, which were described with reference to FIG. 4, and includes an oxide film 40, a semiconductor layer 41, a conductive layer 42, an insulating layer 43, oxide films 60, 61, 62 and 66, nitride films 63 and 65, and insulators 64 and 67.

Concretely, the oxide film 40 is provided on the P-well region PW between the n$^+$ impurity diffusion regions NP1 and NP2. The oxide film 40 includes, for example, silicon oxide ($SiO_2$), and is used as a gate insulating film of the NMOS transistor TrN.

The semiconductor layer 41, conductive layer 42 and insulating layer 43 are successively stacked on the oxide film 40. The semiconductor layer 41 is an N-type semiconductor, and is, for example, polycrystalline silicon which is doped with phosphorus (P).

The conductive layer 42 includes, for example, tungsten silicide (WSi), or a structure (WSi/TiN) in which titanium nitride is stacked on tungsten silicide. The insulating layer 43 includes, for example, silicon nitride (SiN). For example, a set of the semiconductor layer 41 and conductive layer 42 is used as a gate electrode (conductor GCn) of the NMOS transistor TrN. The insulating layer 43 is used, for example, as an etching stopper.

The oxide films 60 and 61 are successively provided on a top surface of the oxide film 40 and on side surfaces of the semiconductor layer 41, conductive layer 42 and insulating layer 43. Each of the oxide films 60 and 61 includes, for example, silicon oxide ($SiO_2$), and is used as a side wall of the gate electrode of the NMOS transistor TrN.

The oxide film 62 and nitride film 63, each of which is continuously provided, are successively provided on the top surface and side surface of the structure formed of the oxide film 40, semiconductor layer 41, conductive layer 42, insulating layer 43 and oxide films 60 and 61, and on the top surface of the P-well region PW. Specifically, the oxide film 62 and nitride film 63 cover the structure corresponding to the gate electrode of the NMOS transistor TrN, and the surface of the semiconductor substrate 20.

The insulator 64 is provided on the nitride film 63. A top surface of the insulator 64 is aligned with, for example, a top surface of the nitride film 63 provided above the semiconductor layer 41. The insulator 64 is used as an interlayer insulating film in the layer in which the structure corresponding to the gate electrode of the NMOS transistor TrN is formed. The insulator 64 includes, for example, NSG (Non-doped silicate glass).

The nitride film 65, oxide film 66 and insulator 67 are successively provided on the top surfaced of the insulator 64 and on the top surface of the nitride film 63 that is provided above the semiconductor layer 41. The nitride film 65 includes, for example, silicon nitride (SiN), and is used, for example, as an etching stopper.

The insulator 67 includes, for example, dTEOS. The dTEOS is a silicon oxide which is formed of TEOS (Tetraethyl ortho-silicate) by plasma CVD (Chemical vapor deposition). The insulator 67 is used as an interlayer insulating film.

In the above-described structure relating to the NMOS transistor TrN, the contact CS is provided on the n$^+$ impurity diffusion region NP, and penetrates (passes through) the insulator 67, oxide film 66, nitride film 65, insulator 64, nitride film 63 and oxide film 62. The contact C0 is provided on the conductive layer 42, and penetrates (passes through) the insulator 67, oxide film 66, nitride film 65, nitride film 63, oxide film 62 and insulating layer 43.

Each of the contacts CS and C0 corresponding to the NMOS transistor TrN includes conductors 70 and 71. The conductor 70 is provided to extend along the Z direction. The conductor 71 is provided in a manner to cover a side surface and a bottom surface of the conductor 70. The conductor 71 includes, for example, titanium nitride (TiN), and is used as a barrier metal in the manufacturing process of the semiconductor device 1. The conductor 70 includes, for example, tungsten (W).

A bottom surface of the conductor 71 in the contact CS is in contact with the n$^+$ impurity diffusion region NP. A bottom surface of the conductor 71 in the contact C0 is in contact with the conductive layer 42. For example, top surfaces of the conductors 70 and 71 in the contact CS, top surfaces of the conductors 70 and 71 in the contact C0 and a top surface of the insulator 67 are aligned with each other. For example, the conductors D0 are provided in an interconnect layer which neighbors the insulator 67.

(Structure of PMOS Transistor TrP)

Next, an example of a more detailed structure of the PMOS transistor TrP will be described.

FIG. 7 illustrates an example of a cross-sectional structure of the PMOS transistor TrP under the memory cell array 10 in the semiconductor device 1 according to the first embodiment.

As illustrated in FIG. 7, a region of the PMOS transistor TrP includes the N-well region NW, p$^+$ impurity diffusion regions PP1 and PP2 and contacts CS and C0, which were described with reference to FIG. 4, and includes an oxide film 50, a nitride film 51, a semiconductor layer 52, a conductive layer 53, an insulating layer 54, oxide films 60, 61, 62 and 66, nitride films 63 and 65, insulators 64 and 67, and epitaxial layers EP.

Concretely, the oxide film 50 is provided on the N-well region. NW between the p$^+$ impurity diffusion regions PP1 and PP2. The oxide film 50 includes, for example, silicon oxide ($SiO_2$), and is used as a gate insulating film of the PMOS transistor TrP.

The nitride film 51, semiconductor layer 52, conductive layer 53 and insulating layer 54 are successively stacked on the oxide film 50. The nitride film 51 is, for example, silicon nitride (SiN), and prevents impurities, which are doped in the semiconductor layer 52, from diffusing into the semiconductor substrate 20. The semiconductor layer 52 is a P-type semiconductor, and is, for example, polycrystalline silicon which is doped with boron (B).

The conductive layer 53 includes, for example, tungsten silicide (WSi), or a structure (WSi/TiN) in which titanium nitride is stacked on tungsten silicide. The insulating layer 54 includes, for example, silicon nitride (SiN). For example, a set of the semiconductor layer 52 and conductive layer 53 is used as a gate electrode (conductor GCp) of the PMOS transistor TrP. The insulating layer 54 is used, for example, as an etching stopper.

The oxide films 60 and 61 are successively provided on a top surface of the oxide film 50 and on side surfaces of the nitride film 51, semiconductor layer 52, conductive layer 53 and insulating layer 54. Each of the oxide films 60 and 61 is used as a side wall of the gate electrode of the PMOS transistor TrP.

The oxide film 62 and nitride film 63, each of which is continuously provided, are successively provided on the top surface and side surface of the structure formed of the oxide film 50, nitride film 51, semiconductor layer 52, conductive layer 53, insulating layer 54 and oxide films 60 and 61, and on the top surface of the N-well region NW. Specifically, the oxide film 62 and nitride film 63 cover the structure corresponding to the gate electrode of the PMOS transistor TrP, and the surface of the semiconductor substrate 20.

The insulator 64 is provided on the nitride film 63. A top surface of the insulator 64 is aligned with, for example, a top surface of the nitride film 63 provided above the semiconductor layer 52. The nitride film 65, oxide film 66 and insulator 67 are successively provided on the top surface of the insulator 64 and on the top surface of the nitride film 63 that is provided above the semiconductor layer 52.

The epitaxial layer EP is provided in a columnar shape on each of the $p^+$ impurity diffusion regions PP1 and PP2. In other words, the epitaxial layer EP is provided in a bottom portion of a contact hole which extends along the Z direction and penetrates the insulator 67, oxide film 66, nitride film 65, insulator 64, nitride film 63 and oxide film 62.

The epitaxial layer EP is a single-crystal semiconductor which is formed by epitaxial growth, and is, for example, non-doped silicon (Si).

The epitaxial layer EP may include impurities (e.g. boron, carbon). In this case, the p-type impurity concentration of the epitaxial layer EP is designed to become equal to or lower than the p-type impurity concentration of the $p^+$ impurity diffusion region PP. The impurities doped in the epitaxial layer EP may be doped when the epitaxial layer EP is formed, or may be doped by impurity diffusion from a structural element which is in contact with the epitaxial layer EP.

In the region of the PMOS transistor TrP, the contact CS is provided on the epitaxial layer EP. A set of the contact CS and epitaxial layer EP penetrates (passes through) the insulator 67, oxide film 66, nitride film 65, insulator 64, nitride film 63 and oxide film 62. The contact C0 is provided on the conductive layer 53, and penetrates (passes through) the insulator 67, oxide film 66, nitride film 65, nitride film 63, oxide film 62 and insulating layer 54.

The contact CS corresponding to the PMOS transistor TrP includes conductors 70 and 71 and a semiconductor 72. The structure of the contact C0 corresponding to the PMOS transistor TrP is the same as the structure of the contact C0 corresponding to the NMOS transistor TrN.

In the contact CS, the conductor 70 is provided to extend along the Z direction. The conductor 71 is provided in a manner to cover a side surface and a bottom surface of the conductor 70. The semiconductor 72 is provided in a manner to cover a side surface and a bottom surface of the conductor 71.

The semiconductor 72 is silicon (Si) which is doped with boron (B), or polycrystalline silicon (Si) which is doped with boron (B) and carbon (C). The boron concentration in the semiconductor 72 is, for example, $10^{19}$ (atoms/cm$^3$) or more. The carbon concentration in the semiconductor 72 in the case where carbon is doped is, for example, $10^{19}$ (atoms/cm$^3$) or more, and is designed like the boron concentration.

Note that in the semiconductor 72, a preferable boron concentration is on the order of $10^{21}$ (atoms/cm$^3$), and a preferable carbon concentration is on the order of $10^{21}$ (atoms/cm$^3$). As the boron concentration in the part in which the contact CS and epitaxial layer EP are put in contact becomes higher, the contact resistance between the contact CS and epitaxial layer EP becomes lower.

A bottom surface of the semiconductor 72 in the contact CS is in contact with the epitaxial layer EP. A bottom surface of the conductor 71 in the contact C0 is in contact with the conductive layer 53. For example, top surfaces of the conductors 70 and 71 and semiconductor 72 in the contact CS, top surfaces of the conductors 70 and 71 in the contact C0 and a top surface of the insulator 67 are aligned with each other.

[1-2] Manufacturing Method of Semiconductor Device 1

FIG. 8 is a flowchart illustrating an example of manufacturing steps of the semiconductor device 1 according to the first embodiment. Each of FIG. 9 to FIG. 14 illustrates an example of the cross-sectional structure including the structure corresponding to the NMOS transistor TrN and PMOS transistor TrP in the manufacturing steps of the semiconductor device 1 according to the first embodiment.

Hereinafter, referring to FIG. 8 as needed, a description is given of an example of a series of manufacturing steps from the formation of the NMOS transistor TrN and PMOS transistor TrP to the formation of the contacts CS and C0 in the first embodiment.

Figure 9:
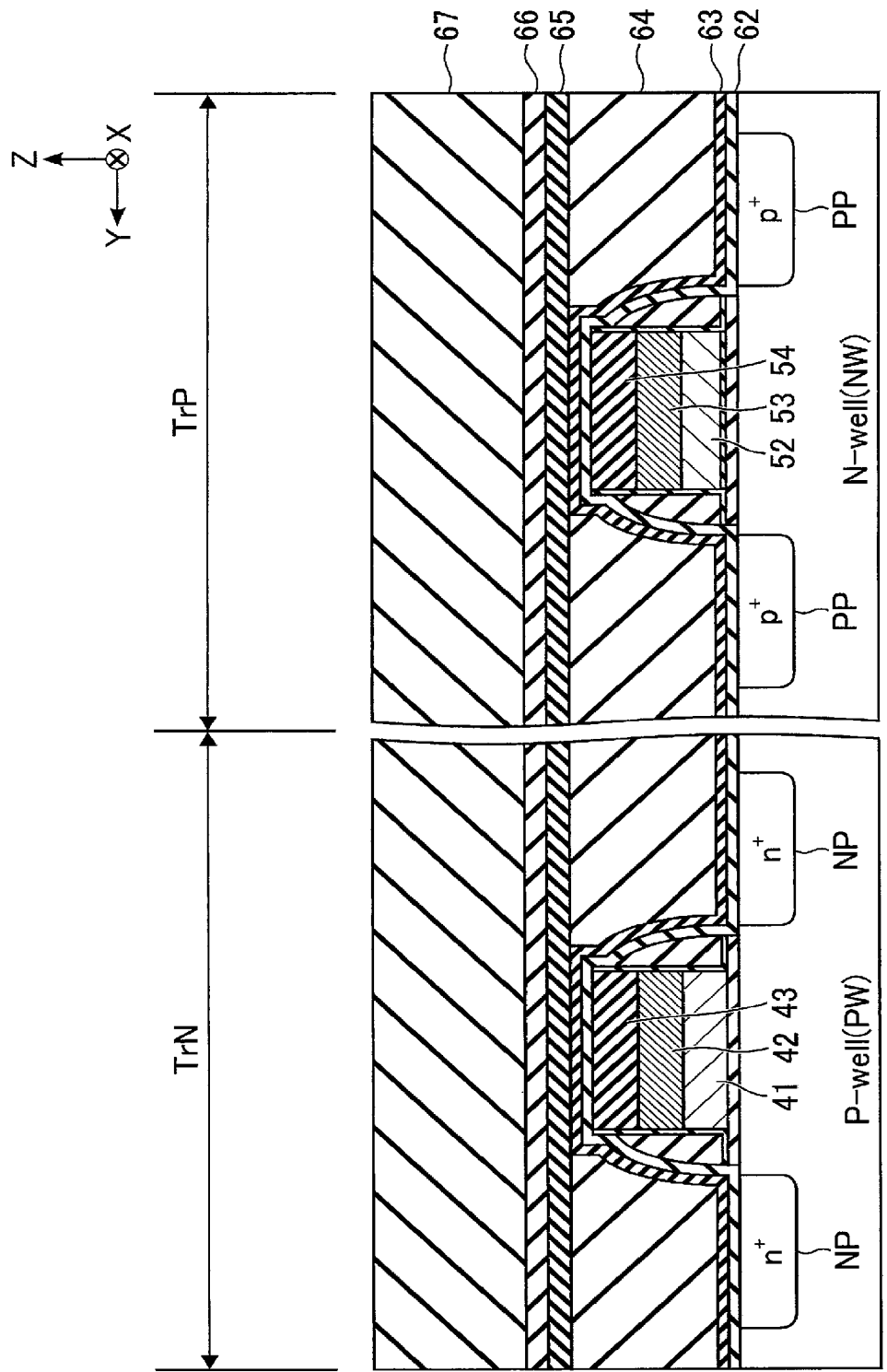

To begin with, as illustrated in FIG. 9, an NMOS transistor TrN and a PMOS transistor TrP are formed (step S1).

The structure of the NMOS transistor TrN illustrated in FIG. 9 is the same as the structure in which the contacts CS and C0 are omitted from the structure of the NMOS transistor TrN described with reference to FIG. 6. The structure of the PMOS transistor TrP illustrated in FIG. 9 is the same as the structure in which the contacts CS and C0 and epitaxial layers EP are omitted from the structure of the PMOS transistor TrP described with reference to FIG. 7.

Figure 10:
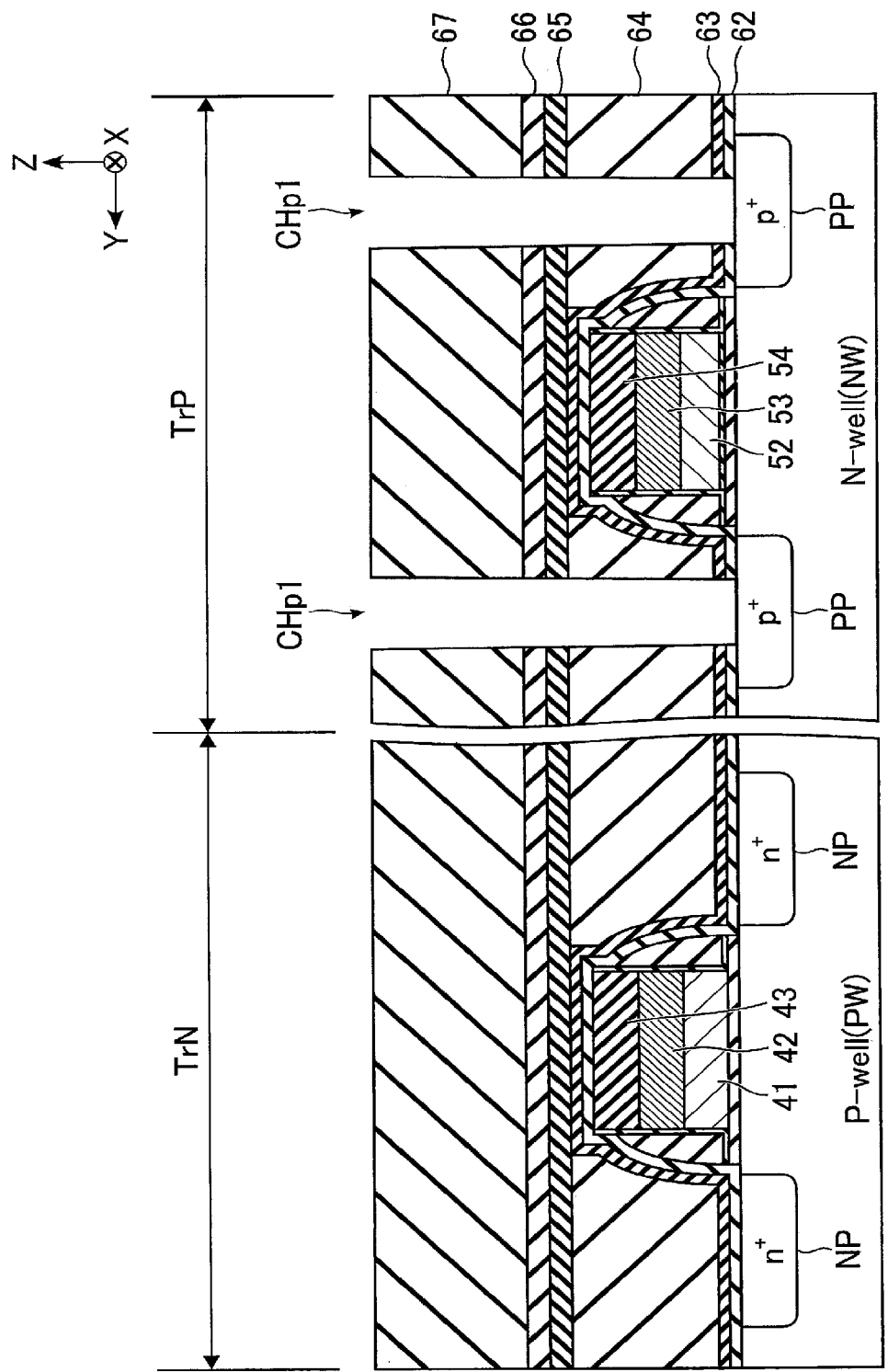

Next, as illustrated in FIG. 10, contact holes CHp1 corresponding to the contacts CS of the PMOS transistor TrP are formed (step S2). As an etching method in this manufacturing step, for example, anisotropic etching such as reactive ion etching (RIE) is used.

In this manufacturing step, the contact hole CHp1 penetrates the insulator 67, oxide film 66, nitride film 65, insulator 64, nitride film 63 and oxide film 62. In addition, the surface of the $p^+$ impurity diffusion region PP is exposed at a bottom portion of the contact hole CHp1.

Figure 11:
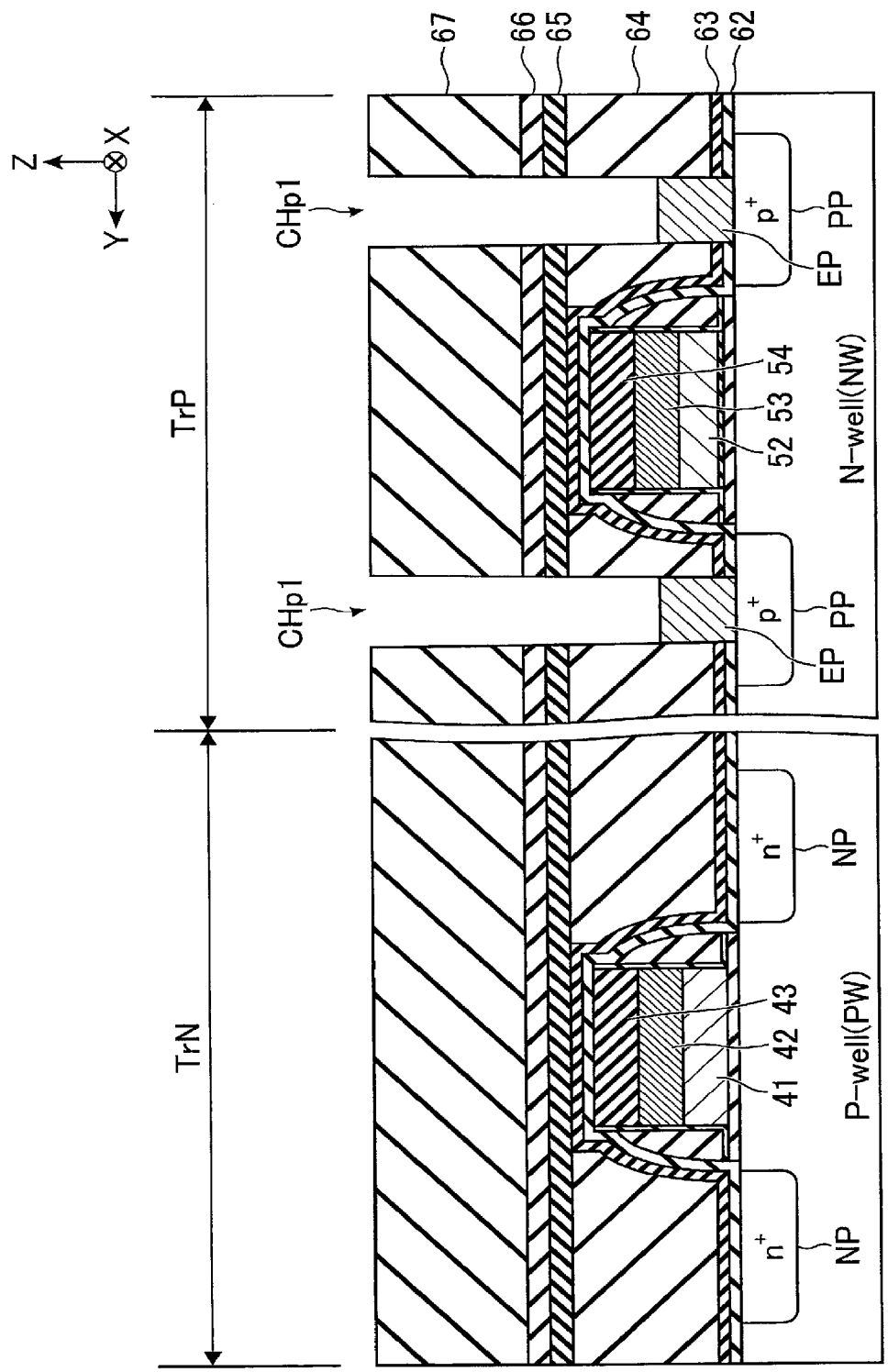

Subsequently, as illustrated in FIG. 11, epitaxial layers EP are formed in bottom portions of the contact holes CHp1 (step S3). Concretely, for example, epitaxial growth is performed based on silicon (Si) in the N-well region NW, and single-crystal silicon is formed on the top surface of the $p^+$ impurity diffusion region PP. The epitaxial layer EP formed in this manufacturing step may be doped with impurities, or may not be doped with impurities.

Next, as illustrated in FIG. 12, a semiconductor 72 is formed on a top surface of the insulator 67 and on a side surface and a bottom surface of each contact hole CHp1 (step S4). For example, the film thickness of the semiconductor 72 formed is this manufacturing step is adjusted such that the contact hole CHp1 is not completely filled.

Figure 13:
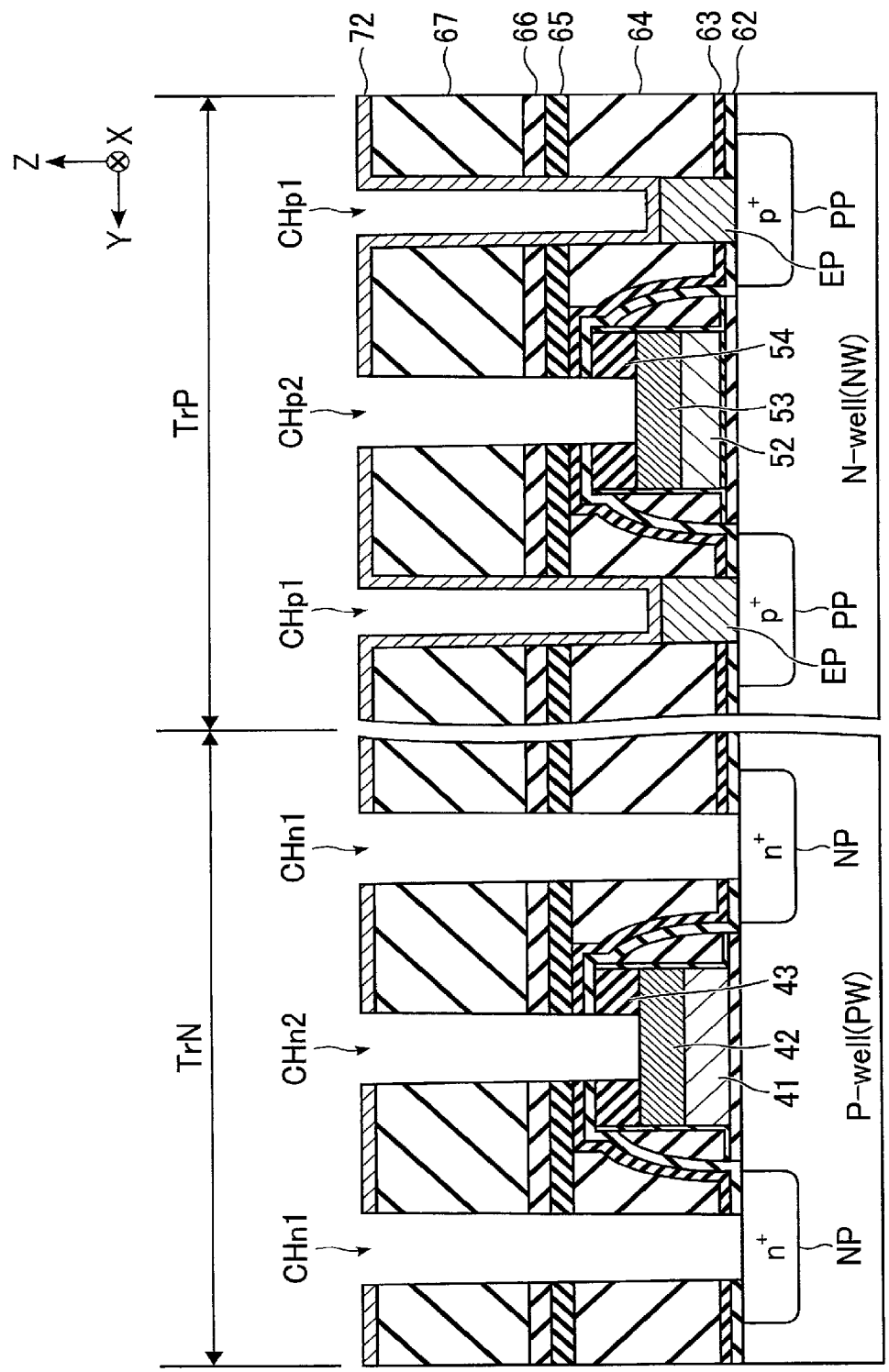

Subsequently, as illustrated in FIG. 13, contact holes CHn1 and CHn2 corresponding to the contacts CS and C0 of the NMOS transistor TrN, and a contact hole CHp2 corresponding to the contact C0 of the PMOS transistor TrP are formed (step S5). As an etching method in this manufacturing step, for example, anisotropic etching such as RIE is used.

In this manufacturing step, the contact hole CHn1 penetrates the semiconductor 72, insulator 67, oxide film 66, nitride film 65, insulator 64, nitride film 63 and oxide film 62. In addition, the surface of the $n^+$ impurity diffusion region NP is exposed at a bottom portion of the contact hole CHn1.

The contact hole CHn2 penetrates the semiconductor 72, insulator 67, oxide film 66, nitride film 65, nitride film 63, oxide film 62 and insulating layer 43. In addition, the surface of the conductive layer 42 is exposed at a bottom portion of the contact hole CHn2.

The contact hole CHp2 penetrates the semiconductor 72, insulator 67, oxide film 66, nitride film 65, nitride film 63, oxide film 62 and insulating layer 54. In addition, the surface of the conductive layer 53 is exposed at a bottom portion of the contact hole CHp2.

Next, contacts CS and C0 corresponding to the NMOS transistor TrN and contacts CS and C0 corresponding to the PMOS transistor TrP are formed.

Concretely, for example, conductors 71 and 70 are successively formed by chemical vapor deposition (CVD) (step S6). By this manufacturing step, the conductor 70 is buried in each of the contact holes CHn1, CHn2, CHp1 and CHp2.

Next, the conductors 70 and 71, which are formed outside the contact holes CHn1, CHn2, CHp1 and CHp2, are removed by chemical mechanical polishing (CMP) (step S7). Then, an etch-back process is performed, and the semiconductor 72 formed on the top surface of the insulator 67 is removed (step S8).

As a result, as illustrated in FIG. 14, the contact CS having the bottom surface put in contact with the $n^+$ impurity diffusion region NP is formed in the contact hole CHn1. The contact C0 having the bottom surface put in contact with the conductive layer 42 is formed in the contact hole CHn2. The contact CS having the bottom surface put in contact with the epitaxial layer EP is formed in the contact hole CHp1. The contact C0 having the bottom surface put in contact with the conductive layer 53 is formed in the contact hole CHp2.

As described above, in the manufacturing method of the semiconductor device 1 according to the first embodiment, the structure of the NMOS transistor TrN described with reference to FIG. 6 and the structure of the PMOS transistor TrP described with reference to FIG. 7 are formed.

[1-3] Advantageous Effects of the First Embodiment

Hereinafter, the advantageous effects of the semiconductor device 1 according to the first embodiment will be described in detail.

In the semiconductor device in which memory cells are stacked three-dimensionally, a circuit such as a sense amplifier module may be disposed under the memory cell array in order to suppress an increase in chip area. In the manufacturing process of the semiconductor device with this structure, the memory cell array is formed after the formation of the circuit such as the sense amplifier module.

However, in the semiconductor device with this structure, there is a possibility that the characteristics of the transistors provided under the memory cell array deteriorate due to heat treatment at a time when the memory cell array is formed. For example, by this heat treatment, impurities in the impurity diffusion region corresponding to the source or drain of the transistor may diffuse into the contact that is connected to this impurity diffusion region.

If impurities diffuse into the contact, the impurity concentration in the impurity diffusion region lowers, and it is possible that the contact resistance between the contact and the impurity diffusion region increases. This phenomenon tends to easily occur, in particular, in the contact which is connected to the $p^+$ impurity diffusion region that is doped with boron.

As a countermeasure to this, it is effective to set the dosage of boron at a high concentration in the $p^+$ impurity diffusion region corresponding to the PMOS transistor. Thereby, even when boron diffuses into the contact, boron with a high concentration can be maintained in the impurity diffusion region.

On the other hand, if the dosage of boron in the impurity diffusion region is set at a high concentration, it is possible that the $p^+$ impurity diffusion region in the N-well region may expand by heat treatment. In this case, since the distance between the gate electrode and the $p^+$ impurity diffusion region becomes shorter, there is a possibility that the short channel characteristic of the transistor deteriorates.

Taking the above into account, the semiconductor device 1 according to the first embodiment has such a structure that the impurity concentration in the $p^+$ impurity diffusion region PP is designed at an appropriate concentration for the short channel characteristic, and that the impurity diffusion region PP corresponding to the PMOS transistor TrP and the contact CS are electrically connected via the epitaxial layer EP. Furthermore, the contact CS includes the semiconductor 72, which is doped with boron at a high concentration, in the part where the contact CS comes in contact with the epitaxial layer EP.

When heat treatment at a time of forming the memory cell array is performed on this structure, the expansion of the impurity diffusion region PP can be suppressed since the semiconductor 72, which is doped with boron at a high concentration, is formed spaced apart from the $p^+$ impurity diffusion region PP.

Besides, even if the boron doped in the semiconductor 72 diffuses into the epitaxial layer EP and conductors 70 and 71, the boron concentration in the semiconductor 72 can be kept high. Further, the carbon doped in the semiconductor 72 suppresses diffusion of the boron doped in the semiconductor 72.

Moreover, although the boron in the impurity diffusion region PP may diffuse into the epitaxial layer EP, the diffusion amount of impurities into the single-crystal semiconductor is less than the diffusion amount of impurities into the contact CS in the case in which the $p^+$ impurity diffusion region PP and the contact CS formed of a metal are put in direct contact.

As a result, the semiconductor device 1 according to the first embodiment can suppress an increase in contact resistance between the contact CS and epitaxial layer EP, and can suppress a decrease in short channel characteristic of the PMOS transistor TrP and a variation in impurity concentration of the $p^+$ impurity diffusion region PP. Therefore, the semiconductor device 1 according to the first embodiment can suppress a variation in characteristics of the transistors.

Besides, when the epitaxial layer EP is doped with boron at a concentration which is equal to or less than the impurity concentration in the $p^+$ impurity diffusion region PP, the gradient of impurity concentration between the epitaxial layer EP and $p^+$ impurity diffusion region PP becomes smaller, and also the gradient of impurity concentration between the semiconductor 72 and epitaxial layer EP becomes smaller.

In this case, in the heat treatment at the time of forming the memory cell array, since the diffusion of impurities from the p$^+$ impurity diffusion region PP into the epitaxial layer EP can be suppressed, the variation in impurity concentration in the p$^+$ impurity diffusion region PP can further be suppressed. Similarly, since the diffusion of impurities from the semiconductor 72 into the epitaxial layer EP can be suppressed, the variation in impurity concentration in the semiconductor 72 can be suppressed.

Thereby, the semiconductor device 1 according to the first embodiment can suppress a variance in characteristics in PMOS transistors TrP, and can suppress an increase in contact resistance between the contact CS and p$^+$ impurity diffusion region PP.

In the above-described semiconductor device 1 according to the first embodiment, the semiconductor 72 in the contact CS is the polycrystalline silicon doped with impurities. Specifically, in the first embodiment, the manufacturing step of forming the semiconductor 72 can be realized at a lower cost than in the case of performing an ion implantation process or forming an epitaxial layer EP doped with impurities at a high concentration. Therefore, the semiconductor device 1 according to the first embodiment can suppress an increase in cost.

[2] Second Embodiment

A semiconductor device 1 according to a second embodiment is different from the semiconductor device 1 according to the first embodiment with respect to the timing when an etch-back process is performed on the semiconductor 72. Hereinafter, as regards the semiconductor device 1 according to the second embodiment, different points from the first embodiment will be described.

[2-1] Structure of Transistor TrP

FIG. 15 illustrates an example of a cross-sectional structure of a PMOS transistor TrP under the memory cell array 10 in the semiconductor device 1 according to the second embodiment.

As illustrated in FIG. 15, in the region including the PMOS transistor TrP in the second embodiment, the structure of the contact CS is different from, for example, the structure described with reference to FIG. 7 in the first embodiment.

Concretely, a columnar semiconductor 72 is provided on the epitaxial layer EP. A side surface and a bottom surface of a conductor 70, which extends along the Z direction, is covered with a conductor 71. A bottom surface of the conductor 71 is in contact with a top surface of the conductor 72. In the semiconductor device 1 according to the second embodiment, the semiconductor 72 has no portion which is in contact with an interconnect layer on the insulator 67.

In the contact CS, a side surface of the conductor 71 and a side surface of the semiconductor 72 are continuously provided. In other words, each of the conductor 71 and semiconductor 72 is in contact with a side surface of the contact hole corresponding to the contact CS. In addition, a boundary portion between the conductor 71 and semiconductor 72 is in contact with the side surface of the contact hole.

Since the other structure of the semiconductor device 1 according to the above-described second embodiment is the same as the structure of the semiconductor device 1 according to the first embodiment, a description thereof omitted.

[2-2] Manufacturing Method of Semiconductor Device 1

FIG. 16 is a flowchart illustrating an example of manufacturing steps of the semiconductor device 1 according to the second embodiment. Each of FIG. 17 to FIG. 20 illustrates an example of the cross-sectional structure including the structure corresponding to the NMOS transistor TrN and PMOS transistor TrP in the manufacturing steps of the semiconductor device 1 according to the second embodiment.

Hereinafter, referring to FIG. 16 as needed, a description is given of an example of a series of manufacturing steps from the formation of the NMOS transistor TrN and PMOS transistor TrP to the formation of the contacts CS and C0 in the second embodiment.

To begin with, the processes of steps S1 to S3 are successively performed. Thereby, the transistors TrN and TrP, contact holes CHp1, and epitaxial layers EP are formed, and the same structure as illustrated in FIG. 11 described in the first embodiment is formed.

Figure 17:
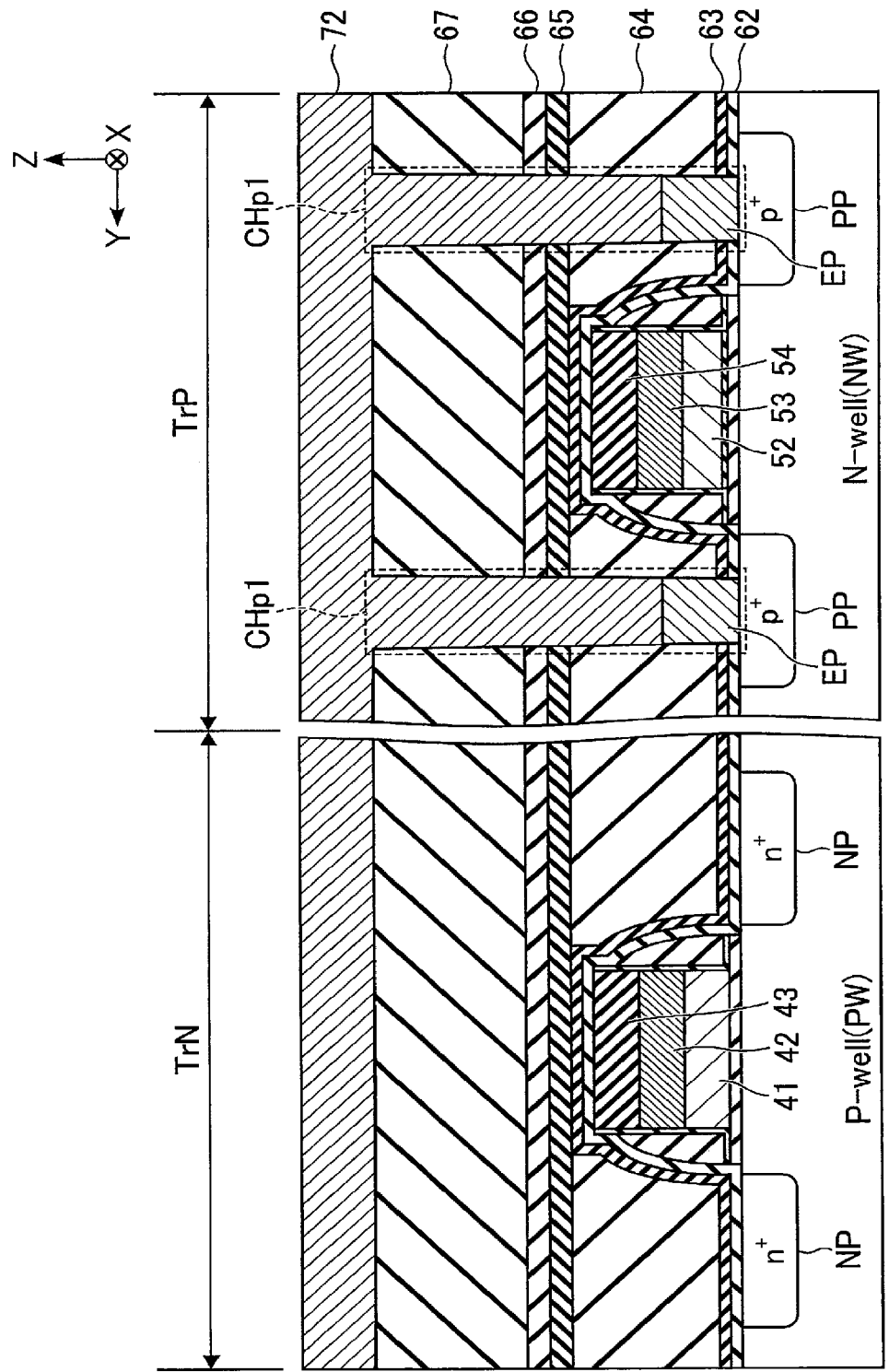

Next, the process of step S4 is performed and, as illustrated in FIG. 17, a semiconductor 72 is formed. In the process of step S4 in the second embodiment, for example, the semiconductor 72 is buried in the contact holes CHp1.

Subsequently, the process of step S8 is executed and, as illustrated in FIG. 18, the semiconductor 72 is etched back. Concretely, the semiconductor 72 formed outside the contact holes in the process of step S4 is removed, and the semiconductor 72 in the contact hole CHp1 is processed to a desired height.

Figure 19:
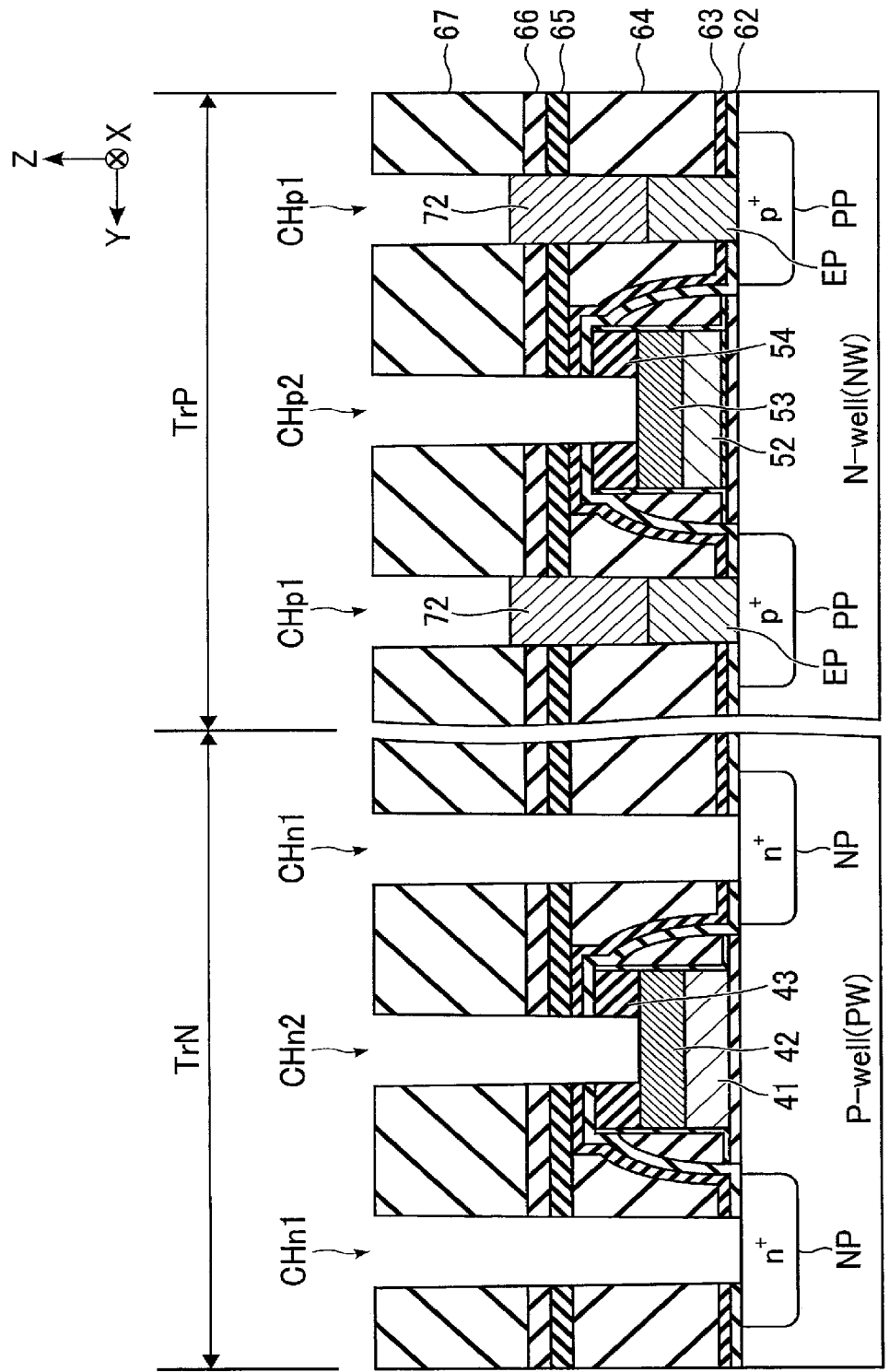

Next, the process of step S5 is executed and, as illustrated in FIG. 19, contact holes CHn1 and CHn2 corresponding to the contacts CS and C0 of the NMOS transistor TrN, and a contact hole CHp2 corresponding to the contact C0 of the PMOS transistor TrP are formed.

Subsequently, the process of step S6 is performed, and conductors 71 and 70 are successively formed. By this manufacturing step, the conductor 70 is buried in each of the contact holes CHn1, CHn2, CHp1 and CHp2.

Next, the process of step S7 is performed, and the conductors 70 and 71, which are formed outside the contact holes CHn1, CHn2, CHp1 and CHp2, are removed by chemical mechanical polishing (CMP). The details of the processes of steps S5 to S7 in the second embodiment are the same as in the first embodiment.

As a result, as illustrated in FIG. 20, the contact CS having the bottom surface put in contact with the n$^+$ impurity diffusion region NP is formed in the contact hole CHn1. The contact C0 having the bottom surface put in contact with the conductive layer 42 is formed in the contact hole CHn2. The contact CS having the bottom surface put in contact with the epitaxial layer EP is formed in the contact hole CHp1. The contact C0 having the bottom surface put in contact with the conductive layer 53 is formed in the contact hole CHp2.

As described above, in the manufacturing method of the semiconductor device 1 according to the second embodiment, the structure of the NMOS transistor TrN described with reference to FIG. 6 in the first embodiment and the structure of the PMOS transistor TrP described with reference to FIG. 15 in the second embodiment are formed.

[2-3] Advantageous Effects of the Second Embodiment

In the semiconductor device 1 according to the second embodiment, the etch-back process of the semiconductor 72, which is doped with boron at a high concentration, is performed before forming the conductors 70 and 71.

In this case, such a structure is formed that no semiconductor 72 is included in the contact portion between the contact CS corresponding to the PMOS transistor TrP and the associated conductor D0. Specifically, the contact area between the conductors 70 and 71 and the conductor D0 is greater in the second embodiment than in the first embodiment.

As a result, in the semiconductor device 1 according to the second embodiment, the contact resistance between the contact CS corresponding to the PMOS transistor TrP and the conductor D0 corresponding to the contact CS can be made less than in the first embodiment.

[2-4] Modification of the Second Embodiment

In the second embodiment, the case was illustrated in which the contact CS corresponding to the PMOS transistor TrP is formed of the conductors 70 and 71 and semiconductor 72. However, the structure of the contact CS corresponding to the PMOS transistor TrP may be a different structure.

Figure 21:
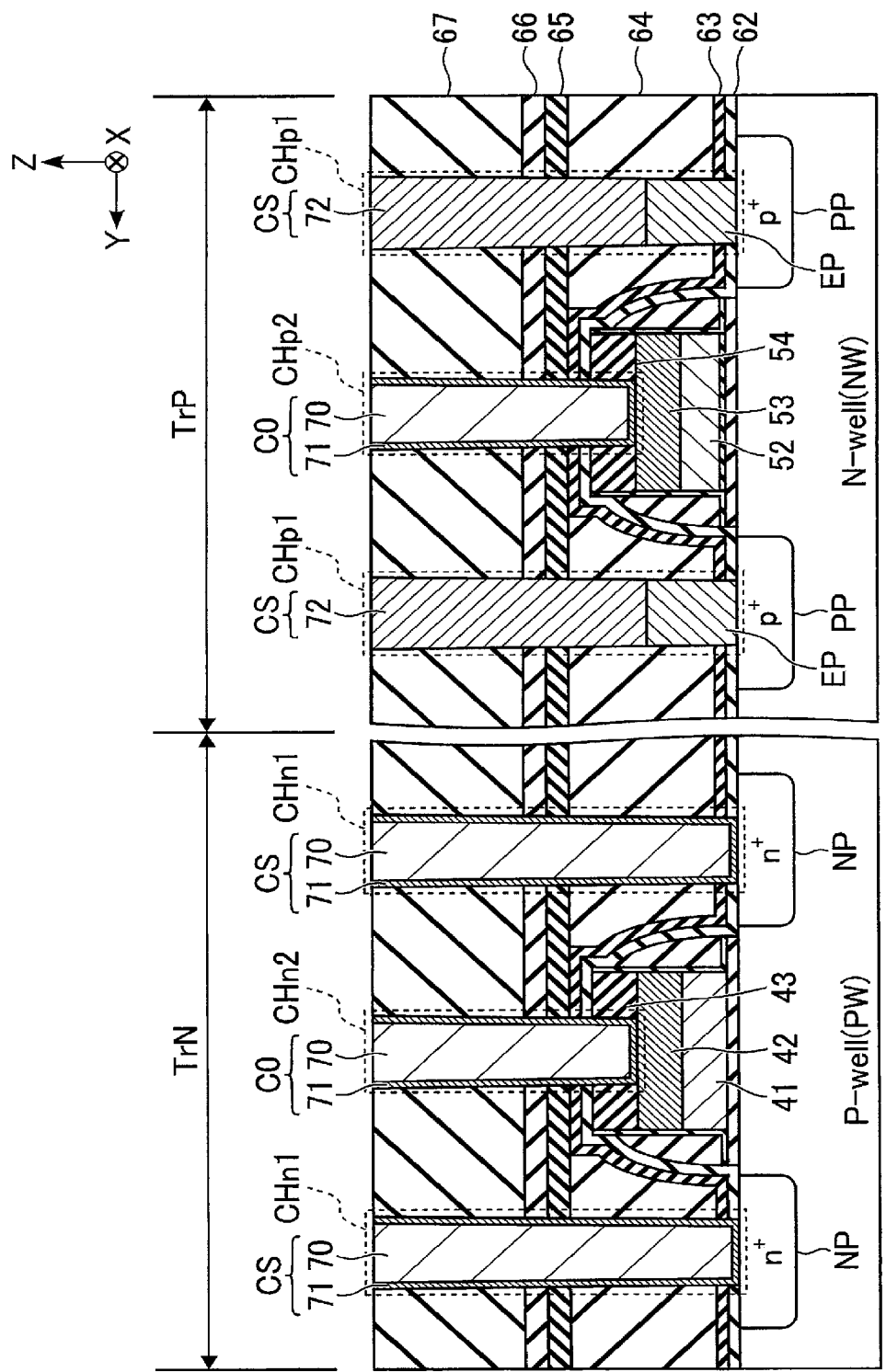
FIG. 21 is a cross-sectional view of an NMOS transistor and a PMOS transistor in the semiconductor device according to a modification of the second embodiment.

FIG. 21 illustrates an example of a cross-sectional structure including a structure corresponding to the NMOS transistor TrN and PMOS transistor TrP in a modification of the second embodiment.

The structure in the region illustrated in FIG. 21 differs from the structure in the region illustrated in FIG. 20 described in the second embodiment, with respect to the structure of the contact CS corresponding to the PMOS transistor TrP.

Concretely, in the modification of the second embodiment, the contact CS corresponding to the PMOS transistor TrP includes the semiconductor 72 and includes neither the conductor 70 nor conductor 71. Specifically, in the modification of the second embodiment, the columnar semiconductor 72 is buried as the contact CS above the epitaxial layer EP in the contact hole CHp1 corresponding to the PMOS transistor TrP.

In addition, a top surface of the columnar semiconductor 72 is aligned with top surfaces of the contacts CS and C0 corresponding to the NMOS transistor TrN and a top surface of the contact C0 corresponding to the PMOS transistor TrP. When the semiconductor device 1 has this structure, the semiconductor 72, which forms the contact CS corresponding to the PMOS transistor TrP, is put in direct contact with the conductor D0 provided in the interconnect layer above the insulator 67.

The structure of the contact. CS corresponding to the PMOS transistor TrP in the above-described modification of the second embodiment may be formed, for example, when the etch-back amount in step S8 is small in the manufacturing method described with reference to FIG. 16 in the second embodiment.

For example, in the etch-back process in step S8, when the semiconductor 72 on the insulator 67 is removed and the recess amount of the semiconductor 72 in the contact hole CHp1 is small, the structure of the contact CS corresponding to the PMOS transistor TrP in the modification of the second embodiment can be formed.

In this case, too, the contact resistance between the semiconductor 72, which forms the contact CS corresponding to the PMOS transistor TrP, and the conductor D0, which is in contact with the semiconductor 72, can be suppressed since the semiconductor 72 includes boron at a high concentration. Therefore, the same advantageous effects as in the first embodiment can be obtained by the structure of the contact. CS corresponding to the PMOS transistor TrP in the modification of the second embodiment.

[3] Other Modifications, Etc.

A semiconductor device according to an embodiment includes an N-well region, a first gate electrode, a single-crystal first semiconductor, and a first contact. The N-well region includes two P-type impurity diffusion regions. The first gate electrode is provided above the N-well region between the two P-type impurity diffusion regions. The first gate electrode is opposed to the N-well region via a gate insulating film. The single-crystal first semiconductor is provided in a columnar shape on at least one of the two P-type impurity diffusion regions. The first contact includes a polycrystalline second semiconductor. The second semiconductor is provided on the first semiconductor and includes P-type impurities. Thereby, in the semiconductor device according to the embodiment, the variation in characteristic of transistors can be suppressed.

The manufacturing steps described in the above-described embodiments and modification are merely examples, and other processes may be inserted between the manufacturing steps, and the manufacturing steps may be interchanged as appropriate. Any manufacturing steps may be applied as the manufacturing steps of the semiconductor device 1, if the structures described in the above embodiments and modification can be formed.

In the above embodiments, the case was illustrated in which the nitride film is used as an etching stopper at the time of forming the contact holes corresponding to the impurity diffusion regions, but the embodiments are not limited to this. Other materials may be used in place of the nitride film 63 if the materials are usable as the etching stopper.

In the manufacturing steps described in the above embodiments, the case was illustrated in which the semiconductor 72 doped with impurities is formed at the time of forming the semiconductor 72 (polycrystalline silicon), but the embodiments are not limited to this. For example, after a non-doped semiconductor 72 is formed, the semiconductor 72 may be doped with impurities.

In the above embodiments, each of the contacts CS and C0 and the epitaxial layer EP were described separately. However, the epitaxial layer EP may be regarded as a part of the contact CS. For example, in the first embodiment, the contact CS corresponding to the PMOS transistor TrP may be regarded as including at least the semiconductor 72 and epitaxial layer EP. In addition, the embodiments are not limited to the case in which the contact CS is provided on each of the $p^+$ impurity diffusion regions PP1 and PP2. The contact CS may be provided on at least one of the $p^+$ impurity diffusion regions PP1 and PP2.

In the above embodiments, the structure of the memory cell array 10 may be a different structure. For example, the memory pillar MP may have such a structure that a plurality of pillars are coupled in the Z direction. For example, the memory pillar MP may have such a structure that a pillar penetrating the conductor 24 (select gate line SGD) and a pillar penetrating the conductors 23 (word lines WL) are coupled. Besides, the memory pillar MP may have such a structure that a plurality of pillars, which penetrate the conductors 23, respectively, are coupled in the Z direction.

In the above embodiments, the case was illustrated in which the semiconductor device 1 has such a structure that the circuit such as the sense amplifier module 16 is provided under the memory cell array 10. However, the embodiments are not limited to this. For example, the semiconductor device 1 may have such a structure that the memory cell array 10 is formed on the semiconductor substrate 20. In this case, in the memory pillar MP, for example, the semiconductor 31 and source line SL are electrically connected via the bottom surface of the memory pillar MP.

In addition, in the above embodiments, the case was illustrated in which the semiconductor device 1 is the NAND flash memory. However, the structure of each of the NMOS transistor TrN and PMOS transistor TrP described in each embodiment is also applicable to other semiconductor devices. Specifically, the purpose of use of the semiconductor device including the structures of the NMOS transistor TrN and PMOS transistor TrP is not limited to semiconductor memories.

In the present specification, the term "connection" means an electrical connection, and does not exclude a connection with another element being interposed.

In the present specification, the term "conductivity type" means an N type or a P type. For example, a first conductivity type corresponds to the P type, and a second conductivity type corresponds to the N type.

In the present specification, the term "N-type impurity diffusion region" corresponds to the n$^+$ impurity diffusion region NP, and "P-type impurity diffusion region" corresponds to the p$^+$ impurity diffusion region PP.

In the present specification, the term "polycrystalline silicon" can be restated as "polycrystalline semiconductor".

In the present specification, the expression "columnar" refers to a structure formed in the contact hole. Thus, in this specification, for example, regardless of the height of the epitaxial layer EP, this epitaxial layer EP is regarded as being "columnar".

In the present specification, the expression "top surfaces are aligned" means that the distances in the Z direction between the surface of the semiconductor substrate 20, for instance, and certain structural elements are substantially equal between these target structural elements. In addition, the expression "top surfaces are aligned" may also mean that, for example, the top surface of a first structural element and the top surface of a second structural element are in contact with an identical interconnect layer or insulating layer.

In the present specification, the expression "side surfaces are continuously provided" means that, at a boundary portion between first and second structural elements formed in the same contact hole, a variation between an outside diameter of the first structural element and an outside diameter of the second structural element is continuous. The "outside diameter" means, for example, an outside diameter in a cross section parallel to the semiconductor substrate 20.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   an N-well region including two P-type impurity diffusion regions;
   a first gate electrode above the N-well region between the two P-type impurity diffusion regions, the first gate electrode being opposed to the N-well region via a gate insulating film;
   a single-crystal first semiconductor provided in a columnar shape on at least one of the two P-type impurity diffusion regions; and
   a first contact including a polycrystalline second semiconductor and a first conductor, a core of the first contact being filled in with the first conductor, the polycrystalline second semiconductor being provided on the single-crystal first semiconductor and between the single-crystal first semiconductor and the first conductor, and including P-type impurities,
   wherein a side surface of the first conductor and a bottom surface of the first conductor are covered with the polycrystalline second semiconductor, and a top surface of the first conductor and a top surface of the polycrystalline second semiconductor are aligned with each other.

2. The semiconductor device of claim 1, wherein the first conductor is a metal.

3. The semiconductor device of claim 1, further comprising:
   a second contact on the first gate electrode, wherein
   a top surface of the second contact, the top surface of the first conductor and the top surface of the polycrystalline second semiconductor are aligned with each other.

4. The semiconductor device of claim 3, wherein
   the second contact includes a second conductor, and
   each of the first conductor and the second conductor includes an identical conductive material.

5. The semiconductor device of claim 1, wherein
   the polycrystalline second semiconductor includes boron as the P-type impurities, and
   a boron concentration in the polycrystalline second semiconductor is $10^{19}$ (atoms/cm$^3$) or more.

6. The semiconductor device of claim 1, wherein
   the polycrystalline second semiconductor further includes carbon, and
   a carbon concentration in the polycrystalline second semiconductor is $10^{19}$ (atoms/cm$^3$) or more.

7. The semiconductor device of claim 1, further comprising:
   a P-well region including two N-type impurity diffusion regions;
   a second gate electrode above the P-well region between the two N-type impurity diffusion regions, the second gate electrode and the P-well region being opposed to each other via a gate insulating film; and
   a third contact on at least one of the two N-type impurity diffusion regions, no columnar single-crystal semiconductor being included between the third contact and the at least one of the two N-type impurity diffusion regions.

8. The semiconductor device of claim 1, further comprising:
   a multilayer body provided in a layer above a top surface of the polycrystalline second semiconductor, the multilayer body including alternately stacked insulating layers and conductive layers; and a plurality of pillars each penetrating the multilayer body, intersection portions between the pillars and the conductive layers functioning as memory cells.

9. A semiconductor device comprising:
an N-well region including two P-type impurity diffusion regions;
a first gate electrode above the N-well region between the two P-type impurity diffusion regions, the first gate electrode being opposed to the N-well region via a gate insulating film;
a single-crystal first semiconductor provided in a columnar shape on at least one of the two P-type impurity diffusion regions; and
a first contact including a polycrystalline second semiconductor and a first conductor, a core of the first contact being filled in with the first conductor, the polycrystalline second semiconductor being provided on the single-crystal first semiconductor and between the single-crystal first semiconductor and the first conductor, and including P-type impurities,
wherein the first conductor is provided on the polycrystalline second semiconductor, and a side surface of the first conductor and a side surface of the polycrystalline second semiconductor are continuously provided.

10. The semiconductor device of claim 9, wherein the first conductor is a metal.

11. The semiconductor device of claim 9, further comprising:
a second contact on the first gate electrode, wherein
a top surface of the second contact and a top surface of the first conductor are aligned with each other.

12. The semiconductor device of claim 11, wherein
the second contact includes a second conductor, and
each of the first conductor and the second conductor includes an identical conductive material.

13. The semiconductor device of claim 9, wherein
the polycrystalline second semiconductor includes boron as the P-type impurities, and
a boron concentration in the polycrystalline second semiconductor is $10^{19}$ (atoms/cm$^3$) or more.

14. The semiconductor device of claim 9, wherein
the polycrystalline second semiconductor further includes carbon, and
a carbon concentration in the polycrystalline second semiconductor is $10^{19}$ (atoms/cm$^3$) or more.

15. The semiconductor device of claim 9, further comprising:
a P-well region including two N-type impurity diffusion regions;
a second gate electrode above the P-well region between the two N-type impurity diffusion regions, the second gate electrode and the P-well region being opposed to each other via a gate insulating film; and
a third contact on at least one of the two N-type impurity diffusion regions, no columnar single-crystal semiconductor being included between the third contact and the at least one of the two N-type impurity diffusion regions.

16. The semiconductor device of claim 9, further comprising:
a multilayer body provided in a layer above a top surface of the polycrystalline second semiconductor, the multilayer body including alternately stacked insulating layers and conductive layers; and
a plurality of pillars each penetrating the multilayer body, intersection portions between the pillars and the conductive layers functioning as memory cells.

17. A semiconductor device comprising:
an N-well region including two P-type impurity diffusion regions;
a first gate electrode above the N-well region between the two P-type impurity diffusion regions, the first gate electrode being opposed to the N-well region via a gate insulating film;
a single-crystal first semiconductor provided in a columnar shape on at least one of the two P-type impurity diffusion regions;
a first contact including a polycrystalline second semiconductor and a first conductor, a core of the first contact being filled in with the first conductor, the polycrystalline second semiconductor being provided on the single-crystal first semiconductor and between the single-crystal first semiconductor and the first conductor, and including P-type impurities, and
a second contact on the first gate electrode,
wherein a top surface of the second contact and a top surface of the polycrystalline second semiconductor are aligned with each other.

18. The semiconductor device of claim 17, wherein the polycrystalline second semiconductor is provided in a columnar shape.

19. The semiconductor device of claim 17, wherein the second contact includes a metal.

20. The semiconductor device of claim 17, further comprising:
a multilayer body provided in a layer above a top surface of the polycrystalline second semiconductor, the multilayer body including alternately stacked insulating layers and conductive layers; and
a plurality of pillars each penetrating the multilayer body, intersection portions between the pillars and the conductive layers functioning as memory cells.

* * * * *